United States Patent
Byun

(10) Patent No.: US 11,360,886 B2
(45) Date of Patent: Jun. 14, 2022

(54) STORAGE DEVICE AND OPERATING METHOD THEREOF

(71) Applicant: SK hynix Inc., Icheon (KR)

(72) Inventor: Eu Joon Byun, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/925,181

(22) Filed: Jul. 9, 2020

(65) Prior Publication Data
US 2021/0141722 A1  May 13, 2021

(30) Foreign Application Priority Data
Nov. 7, 2019 (KR) ................. 10-2019-0141662

(51) Int. Cl.
| | | |
|---|---|---|
| G06F 12/02 | (2006.01) | |
| G06F 12/08 | (2016.01) | |
| G06F 9/30 | (2018.01) | |
| G06F 3/06 | (2006.01) | |
| G06F 12/06 | (2006.01) | |
| G11C 11/56 | (2006.01) | |
| G06F 12/0811 | (2016.01) | |
| G06F 12/0891 | (2016.01) | |

(52) U.S. Cl.
CPC ...... *G06F 12/0246* (2013.01); *G06F 9/30047* (2013.01); *G06F 12/0811* (2013.01); *G06F 12/0891* (2013.01); *G06F 3/064* (2013.01); *G06F 3/0611* (2013.01); *G06F 3/0634* (2013.01); *G06F 3/0658* (2013.01); *G06F 12/023* (2013.01); *G06F 12/063* (2013.01); *G06F 2212/7201* (2013.01); *G11C 11/5628* (2013.01)

(58) Field of Classification Search
CPC ............ G06F 12/0246; G06F 12/0811; G06F 9/30047; G06F 12/0891; G06F 2212/7201; G06F 3/0658; G06F 3/0611; G06F 3/0634; G06F 3/064; G06F 12/023; G06F 12/063; G06F 2212/1024; G11C 11/5628
See application file for complete search history.

(56) References Cited

U.S. PATENT DOCUMENTS

| | | | | |
|---|---|---|---|---|
| 7,035,989 B1 * | 4/2006 | Hinker | .................. | G06F 12/023 711/171 |
| 2012/0311197 A1 * | 12/2012 | Larson | ..................... | G11C 7/10 710/22 |
| 2021/0034298 A1 * | 2/2021 | Yoon | ........................ | G06F 3/061 |

FOREIGN PATENT DOCUMENTS

| | | |
|---|---|---|
| KR | 10-0771521 B1 | 10/2007 |
| KR | 10-2018-0012653 A | 2/2018 |

* cited by examiner

*Primary Examiner* — Masud K Khan

(57) ABSTRACT

A storage device having an improved write response speed includes a memory device and a memory controller. The memory device including a plurality of turbo write blocks and a plurality of normal memory blocks and a memory controller configured to control the memory device to store data corresponding to a write request received from a host in any one block among the plurality of turbo write blocks and the plurality of normal memory blocks, in response to the write request, wherein the plurality of turbo write blocks respectively include memory cells being programmed to store different numbers of data bits.

18 Claims, 17 Drawing Sheets

FIG. 12

TURBO WRITE FLUSH REQUEST

| TURBO WRITE FLUSH COMMAND | TARGET BLOCK INFORMATION | STORAGE BLOCK INFORMATION |

FIG. 13

TURBO WRITE ADDRESS STORAGE

| TURBO WRITE BLOCK | STORABLE BIT NUMBER | TURBO WRITE ADDRESS INFORMATION |
|---|---|---|
| TWB1 | 1 (SLC) | ADDR1 |
| TWB2 | 2 (MLC) | ADDR2 |
| TWB3 | 3 (TLC) | ADDR3 |
| TWB4 | 2 (MLC) | ADDR4 |
| ⋮ | ⋮ | ⋮ |
| TWBk | 3 (TLC) | ADDRk |

STORAGE DEVICE AND OPERATING METHOD THEREOF

CROSS-REFERENCE TO RELATED APPLICATION

The present application claims priority under 35 U.S.C. § 119(a) to Korean patent application number 10-2019-0141662, filed on Nov. 7, 2019, in the Korean Intellectual Property Office, the entire disclosure of which is incorporated herein by reference.

BACKGROUND

1. Technical Field

The present disclosure generally relates to an electronic device, and more particularly, to a storage device and an operating method thereof.

2. Related Art

A storage device is a device the stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments provide a storage device having an improved write response speed and an operating method thereof.

In accordance with an aspect of the present disclosure, there is provided a memory controller for controlling a memory device, the memory device including a plurality of turbo write blocks and a plurality of normal memory blocks, the memory controller comprising a turbo write controller configured to generate a physical address at which write data corresponding to a write request received from a host is to be stored according to turbo write mode information and turbo write block information, the turbo write mode information and turbo write block information being included in the write request and a memory operation controller configured to control the memory device to store the write data in memory cells corresponding to the physical address, wherein the turbo write mode information is information indicating whether the write data is to be stored in the plurality of turbo write blocks, and the turbo write block information is information indicating a turbo write block in which the write data is to be stored among the plurality of turbo write blocks, wherein a first turbo write block of the plurality of turbo write blocks includes memory cells being programmed to each store a first number of numbers of data bits, a second turbo write block of the plurality of turbo write blocks includes memory cells being programmed to each store a second number of numbers of data bits, and the second number of data bits is different than the first number of data bits.

In accordance with another aspect of the present disclosure, there is provided a method for operating a memory controller for controlling a memory device, the memory device including a plurality of turbo write blocks and a plurality of normal memory blocks, the method comprising receiving a write request from a host, the write request including turbo write mode information and turbo write block information generating a physical address at which write data corresponding to the write request is to be stored according to the turbo write mode information and the turbo write block information and controlling the memory device to store the write data in any one block corresponding to the physical address among the plurality of turbo write blocks and the plurality of normal memory blocks, wherein the turbo write mode information is information indicating whether the write data is to be stored in the plurality of turbo write blocks, and the turbo write block information is information indicating a turbo write block in which the write data is to be stored among the plurality of turbo write blocks, wherein the plurality of turbo write blocks respectively include memory cells being programmed to store different numbers of data bits.

In accordance with another aspect of the present disclosure, there is provided a storage device comprising a memory device including a plurality of turbo write blocks and a plurality of normal memory blocks and a memory controller configured to control the memory device to store data corresponding to a write request received from a host in any one block among the plurality of turbo write blocks and the plurality of normal memory blocks, in response to the write request, wherein the plurality of turbo write blocks respectively include memory cells being programmed to store different numbers of data bits.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 12 illustrates a turbo write flush request in accordance with an embodiment of the present disclosure.

FIG. 13 illustrates a configuration of a turbo write address storage shown in FIGS. 2 and 8.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, illustrative embodiments of the present disclosure will be described in detail with reference to the accompanying drawings in order for those skilled in the art to be able to readily implement the technical gist of the present disclosure.

Figure 1:
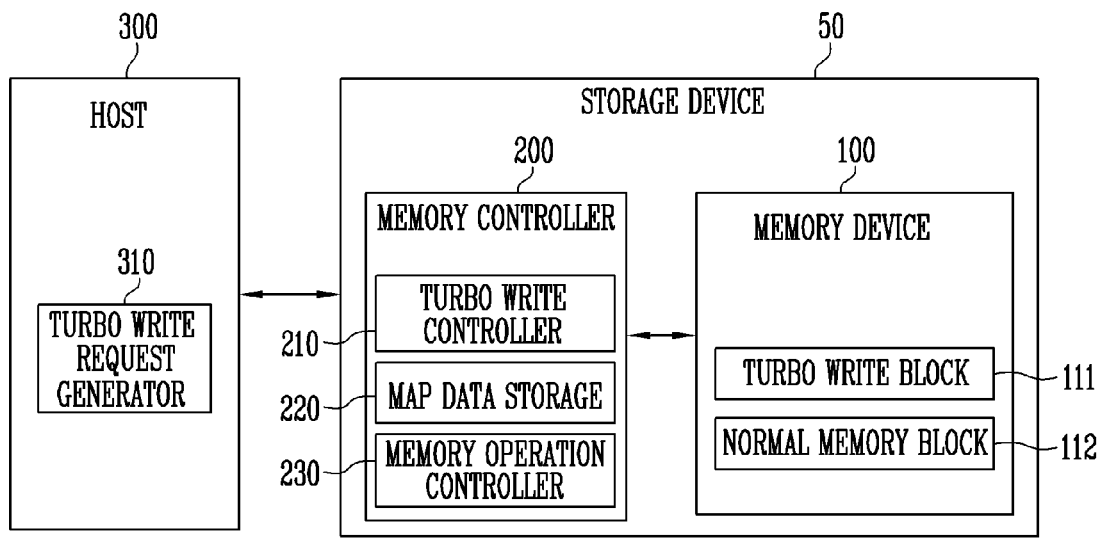
FIG. 1 illustrates a storage device in accordance with an embodiment of the present disclosure.

FIG. 1 is a diagram illustrating a storage device 50 in accordance with an embodiment of the present disclosure.

The storage device 50 may include a memory device 100 and a memory controller 200. The storage device 50 may be a device for storing data under the control of a host 300, such as a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array including a plurality of memory cells for storing data.

The memory cells may each operate as any one of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array may include a plurality of memory blocks. Each memory block may include a plurality of memory cells. A memory block may be a unit for erasing data stored in the memory device 100. In an embodiment, the memory block may include a plurality of pages. The page may be a unit for storing data in the memory device 100 or reading data stored in the memory device 100.

In an embodiment, the memory blocks included in the memory device 100 may include a turbo write block 111 and a normal memory block 112. The turbo write block 111 may be a memory block which is used to store data when turbo write mode information included in a write request provided from the host 300 is in a set state. The normal memory block 112 may be a memory block which is used to store data when the turbo write mode information included in the write request provided from the host 300 is in a reset state.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 may receive a command and an address from the memory controller 200, and access an area of the memory cell array selected by the address. That is, the memory device 100 may perform an operation corresponding to the received command on the area selected by the address. For example, the memory device 100 may perform a program operation, a read operation, or an erase operation. The program operation may be an operation of storing data into memory cells included in the memory device 100. The memory device 100 may perform a program operation of storing data into an area selected by an address according to a program command received from the memory controller

200. The read operation may be an operation of sensing data stored in memory cells by using a read voltage. The memory device 100 may sense data stored in an area selected by an address according to a read command received from the memory controller 200. The erase operation may be an operation of erasing data stored in memory cells. The memory device 100 may erase data stored in an area selected by an address according to an erase command received from the memory controller 200. In an embodiment, that data stored in memory cells being erased may mean that a threshold voltage of the memory cells is decreased to belong to a threshold voltage distribution corresponding to an erase state.

A turbo write function may be a function of storing data in the turbo write block 111 in response to a write request.

The turbo write function may include a turbo write operation in which the host 300 requests data to be stored into the turbo write block 111 and a turbo write flush operation in which the host 300 requests the turbo write block 111 to be emptied.

The turbo write block 111 may be a memory block in which the host 300 is to store data according to the turbo write operation. The turbo write block 111 may be a memory block defined by the host 300. The host 300 may control the storage device 50 to allocate a portion of a storable capacity of the storage device 50 for the purpose of the turbo write function. The host 300 may request the storage device 50 to specify a capacity and allocate some memory blocks among the memory blocks included in the memory device 100 for the purpose of the turbo write function. Therefore, the host 300 may determine whether data to be stored is to be stored in the turbo write block 111 or is to be stored in the normal memory block 112.

A number of bits which a memory cell included in the turbo write block 111 stores may be smaller than a number of bits which a memory cell included in the normal memory block 112 stores. For example, the memory cell included in the turbo write block 111 may be configured as an SLC, and the memory cell included in the normal memory block 112 may be configured as an MLC. Alternatively, the memory cell included in the turbo write block 111 may be configured as an SLC, MLC or TLC, and the memory cell included in the normal memory block 112 may be configured as a QLC.

Therefore, a speed at which data is stored in the turbo write block 111 may be faster than a speed at which the data is stored in the normal memory block 112. In an embodiment, the turbo write bock 111 may be a memory block in which data is temporarily stored before the data is stored in the normal memory block 112.

Whether data is to be stored in the turbo write block 111 may be determined according to a request from the host 300. Since the host 300 may use the turbo write block 111 as a kind of cache buffer, the turbo write block 111 may be referred to as a turbo write buffer.

In an embodiment, the memory controller 200 may perform a turbo write flush operation. The turbo write flush operation may be an operation of emptying the turbo write block 111. The host 300 may provide the memory controller 200 with a turbo write flush request that requests performance of a turbo write flush operation.

In response to the turbo write flush request, the data stored in the turbo write block 111 may be moved to another turbo write block 111 among a plurality of turbo write blocks 111 or to the normal memory block 112.

A speed at which data is stored in the turbo write block 111 may be faster than a speed at which the data is stored in the normal memory block 112. Therefore, in the turbo write flush operation, a speed at which the data stored in the turbo write block 111 may be moved to another turbo write block 111 may be faster than when the data stored in the turbo write block 111 is moved to the normal memory block 112.

In an embodiment, the turbo write function may be implemented in two modes. For example, the turbo write function may be implemented in any one of a reduction mode and a non-reduction mode. The host 300 may determine that the turbo write function is to be used in one of the two modes in advance through communication with the storage device. The reduction mode and the non-reduction mode will be described in more detail later with reference to FIGS. 3 and 4.

In an embodiment, a plurality of turbo write blocks 111 may be provided. The plurality of turbo write blocks 111 may respectively include memory cells storing different numbers of data bits per cell.

For example, the turbo write blocks 111 may include a first turbo write block, a second turbo write block, and a third turbo write block. In an embodiment, the first turbo write block may be programmed using an SLC scheme, the second turbo write block may be programmed using an MLC scheme, and the third turbo write block may be programmed using a TLC scheme.

Whether data is to be stored in the turbo write block 111 or is to be stored in the normal memory block 112 may be determined according to a write request provided from the host 300. The host 300 may allow turbo write block information indicating which turbo write block 111 among the plurality of turbo write blocks 111 the data is to be stored in to be included in the write request, and provide the write request to the storage device 50.

The memory controller 200 may control overall operations of the storage device 50.

When power is applied to the storage device 50, the memory controller 200 may execute firmware (FW) stored in advance.

The FW may include a Host Interface Layer (HIL) which receives a request from the host 300 or outputs a response to the host, a Flash Translation Layer (FTL) which manages an operation between an interface of the host 300 and an interface of the memory device 100, and a Flash Interface Layer (FIL) which provides a command to the memory device 100 or receives a response from the memory device 100.

When a write request is received from the host 300, the memory controller 200 may receive data to be stored and a Logical Address (LA) for identifying the corresponding write data, which are received from the host 300. The memory controller 200 may translate the received LA into a Physical Address (PA) indicating a physical address of memory cells in which the data is to be stored among the memory cells included in the memory device 100. The memory controller 200 may provide the memory device 100 with a program command for storing data, the translated PA, and the data to be stored.

In an embodiment, when an erase request is received from the host 300, the memory controller 200 may receive an LA for identifying data to be erased, which is received from the host 300. The memory controller 200 may determine a PA corresponding to the received LA, and provide the memory device 100 with an erase command and a PA. In various embodiments, in an erase operation, the memory controller 200 may provide the memory device 100 with an erase command and a physical block address.

In an embodiment, the memory controller 200 may control the memory device 100 to autonomously perform a program operation, a read operation, or an erase operation, regardless of any request from the host 300. For example, the memory controller 200 may control the memory device 100 to perform background operations such as wear leveling, garbage collection, and read reclaim.

In an embodiment, the memory controller 200 may include a turbo write controller 210, a map data storage 220, and a memory operation controller 230.

The turbo write controller 210 may determine turbo write mode information and turbo write block information from a write request received from the host. Specifically, the turbo write controller 210 may determine the turbo write mode information and the turbo write block information by decoding the write request.

The turbo write mode information may be information indicating whether write data corresponding to the write request is to be stored in the turbo write block 111. For example, the turbo write mode information in a set state may indicate that the write data is to be stored in the turbo write block 111. Alternatively, the turbo write mode information in a reset state may indicate that the write data is to be stored in the normal memory block 112.

The turbo write block information may include information indicating a turbo write block 111 in which the write data is to be stored from among a plurality of turbo write blocks 111. In an embodiment, the turbo write block information may include information on a number of data bits which can be stored in a memory cell included in the turbo write block 111 into which the write data is to be stored.

In an embodiment, the turbo write controller 210 may determine target block information and storage block information from a turbo write flush request received from the host 300. Specifically, the turbo write controller 210 may determine the target block information and the storage block information by decoding the turbo write flush request. The target block information may include information on a turbo write block which is to be emptied. In an embodiment, the target block information may include information on a number of data bits which can be stored in a memory cell included in a turbo write block on which a turbo write flush operation is to be performed.

The storage block information may include information on a memory block in which data is to be stored according to the turbo write flush operation. In an embodiment, the storage block information may include information on a number of data bits which can be stored by a memory cell included in a memory block in which data is to be stored according to the turbo write flush operation.

In an embodiment, the host 300 may provide the turbo write controller 210 with the turbo write flush request in which the storage block information is omitted. The host 300 may provide the turbo write controller 210 with the turbo write flush request including only the target block information indicating a turbo write block 111 on which the turbo write flush operation is to be performed. The memory operation controller 230 may select a memory block in which data is to be stored as the turbo write block 111 or the normal memory block 112 according to the turbo write flush operation.

The map data storage 220 may include address information of the turbo write block 111 and the normal memory block 112. For example, the map data storage 220 may include information on a PA of the turbo write block 111 and a PA of the normal memory block 112.

The memory operation controller 230 may control an operation of the memory device 100. Specifically, the memory operation controller 230 may determine a PA at which data is stored, based on the turbo write mode information and the turbo write block information determined by the turbo write controller 210.

When the turbo write mode information included in the write request is turbo write mode information in the set state, the memory operation controller 230 may acquire a PA of the turbo write block 111 stored in map data storage 220. In an embodiment, the memory operation controller 230 may acquire a PA of a turbo write block 111 indicated by the turbo write block information from among the plurality of turbo write blocks 111 based on the turbo write block information.

When the turbo write mode information included in the write request is turbo write mode information in the reset state, the memory operation controller 230 may acquire a PA of the normal memory block 112 stored in the map data storage 220.

The memory operation controller 230 may provide the memory device 100 with a program command instructing the memory device 100 to store data, a corresponding PA, and the corresponding write data.

In an embodiment, the memory operation controller 230 may determine an address of a target block as a memory block on which the turbo write flush operation is to be performed, based on the target block information included in the turbo write flush request. The memory operation controller 230 may determine an address of a storage block as a memory block to which data stored in the target block is to be moved, based on the storage block information included in the turbo write flush request.

In response to the turbo write flush request, the memory operation controller 230 may control the memory device 100 to read data stored in the target block and store the read data in the storage block.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

In an embodiment, the host 300 may include a turbo write request generator 310.

When the host 300 is to store data to be stored in the turbo write block 111, the host 300 may generate a write request including turbo write mode information in a set state. When the host 300 is to store data to be stored in the normal memory block 112, the host 300 may generate a write request including turbo write mode information in a reset state.

In an embodiment, the host 300 may request the storage device 50 to store data in a specific turbo write block 111 among the plurality of turbo write blocks 111. The host 300 may generate a write request including turbo write block information indicating a number of data bits which can be stored by a memory cell included in the turbo write block 111 that is to store the data among the plurality of turbo write blocks 111.

The host 300 may provide the generated write request to the memory controller 200.

In an embodiment, the host 300 may generate a turbo write flush request including target block information indicating a target block as a turbo write block 111 to be emptied according to a turbo write flush operation. In an embodiment, the target block information may indicate a number of data bits which can be stored by a memory cell included in the target block. The target block may be any one turbo write block 111 among the plurality of turbo write blocks 111.

The host 300 may generate a turbo write flush request including storage block information indicating a storage block as a memory block to which the data stored in the target block is to be moved. In an embodiment, the storage block information may be information on a number of data bits which can be stored by a memory cell included in the storage block. The storage block may be any one turbo write block 111 among the plurality of turbo write blocks 111 or the normal memory block 112.

Figure 2:
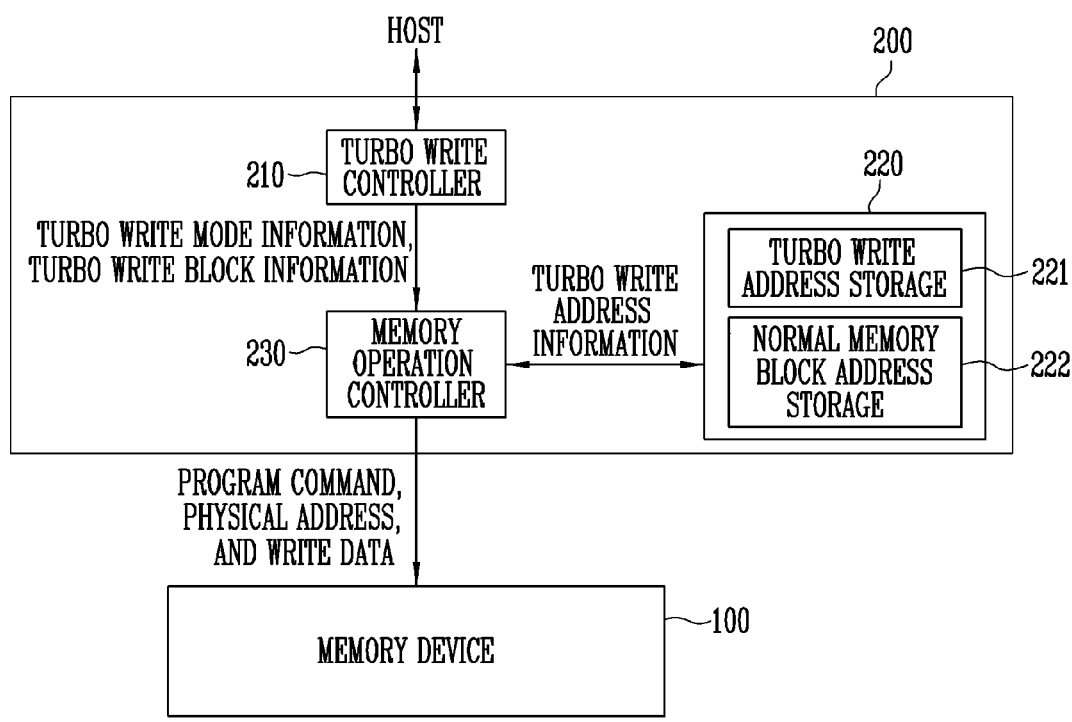
FIG. 2 illustrates a turbo write operation of a memory controller shown in FIG. 1 according to an embodiment.

FIG. 2 is a diagram illustrating in detail the turbo write operation of a memory controller 200 such as shown in FIG. 1.

The memory controller 200 may include a turbo write controller 210, a map data storage 220, and a memory operation controller 230.

The turbo write controller 210 may determine turbo write mode information and turbo write block information from a write request received from the host. Specifically, the turbo write controller 210 may determine the turbo write mode information and the turbo write block information by decoding the write request. The turbo write controller 210 may provide the memory operation controller 230 with the determined turbo write mode information and the determined turbo write block information.

The map data storage 220 may include a turbo write address storage 221 and a normal memory block address storage 222. The turbo write address storage 221 may include turbo write address information indicating a physical address of a turbo write block. Specifically, the turbo write address information may include information on a physical address of free blocks among turbo write blocks. The free block is a block in which there exists a page which has not yet been programmed, and may be a block in a state in which data can be stored into the block.

The normal memory block address storage 222 may include information on a physical address of a normal memory block. Specifically, the normal memory block address storage 222 may include information on a physical address of free blocks among normal memory blocks.

When the turbo write operation or the turbo write flush operation is performed, all pages of a block which was previously determined to be a free block may have data written in them. In this case, the block which was previously determined as the free block may no longer be a free block. Therefore, the map data storage 220 may update the turbo write address information therein whenever the turbo write operation or the turbo write flush operation is performed.

When the turbo write mode information included in the write request is turbo write mode information in a set state, the memory operation controller 230 may acquire the turbo write address information stored in the turbo write address storage 221. In an embodiment, the memory operation controller 230 may acquire a physical address of a turbo write block indicated by the turbo write block information among a plurality of turbo write blocks.

When the turbo write mode information included in the write request is turbo write mode information in a reset state, the memory operation controller 230 may acquire a physical address of the normal memory block stored in the normal memory block address storage 222.

The memory operation controller 230 may provide the memory device 100 with a program command instructing the memory device 100 to store data. Also, the memory operation controller 230 may provide the memory device 100 with the acquired physical address and the write data.

Figure 3:
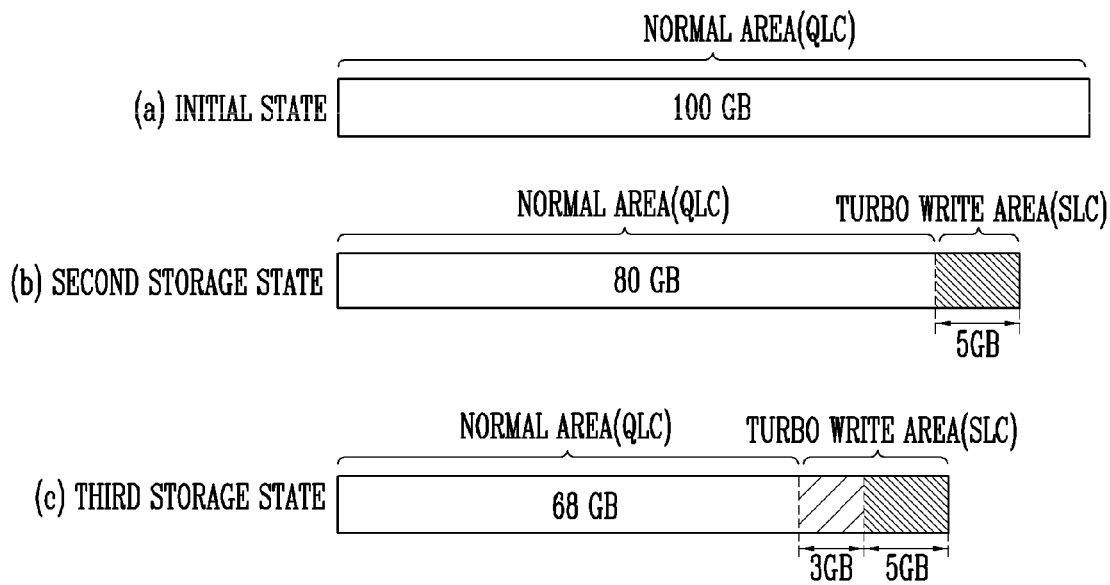
FIG. 3 illustrates a reduction mode according to an embodiment.

FIG. 3 is a diagram illustrating a reduction mode.

Referring to FIG. 3, a storage area of the storage device may be divided into a normal area QLC and a turbo write area SLC. The normal area QLC may be an area representing a storage capacity of the normal memory blocks 112 described with reference to FIG. 1. The turbo write area SLC may be an area representing a storage capacity of the turbo write blocks 111 described with reference to FIG. 1.

The turbo write area SLC may be area which a user cannot arbitrarily access. A number of bits which a memory cell included in the turbo write area SLC stores may be smaller than that which a memory cell included in the normal area QLC stores. For example, the normal area QLC may be configured with a QLC capable of storing four data bits. The turbo write area SLC may be configured with an SLC capable of storing one data bit. However, this is merely illustrative, and the normal area QLC and the turbo write area SLC may be respectively configured with memory cells storing various numbers of data bits.

In an embodiment, the maximum size of the turbo write area SLC may be determined in advance.

The host may use a turbo write function in a reduction mode through communication with the storage device. The reduction mode may be a mode in which the turbo write area SLC is not allocated in advance. The host may request the storage device to use, for example, a turbo write area of up to 10 Gigabytes (GB) in the reduction mode. It is unnecessary for the storage device to allocate the turbo write area of 10 GB in advance. However, whenever the host requests that data be stored in the turbo write area SLC, a corresponding turbo write area is to be secured from among that 10 GB.

Specifically, a storage area in an initial (first) state (a) may be configured with only the normal area QLC. For example, in the initial state (a), the storage area may be configured with only the normal area QLC capable of storing 100 GB of data. In a turbo write operation, a portion of the normal area QLC is allocated as a new turbo write area SLC, and therefore, the capacity of the normal area QLC may decrease. In the reduction mode, the capacity of the normal area QLC may gradually decrease, whenever data is stored in the turbo write area SLC.

A second storage state (b) represents a state in which write data corresponding to 5 GB is stored in the turbo write area SLC. The use of the turbo write area SLC of 5 GB, which is configured to include SLCs, causes a decrease in capacity of 20 GB in the normal area QLC which includes QLCs, since each cell used for one bit in the turbo write area SLC would previously have been capable of storing 4 bits in the normal area QLC. The second storage state (b) may be a state in which a storage area of 5 GB is allocated as the turbo write area SLC, and then a storage area of the second storage state (b) includes a normal area QLC of 80 GB and a turbo write area SLC of 5 GB. In the second storage state (b), the storage device may additionally receive, from the host, a write request for requesting the storage device to store write 3 GB of data in the turbo write area SLC, resulting in the state changing to a third storage state (c).

The third storage state (c) represents a state in which write data corresponding to 3 GB is additionally stored in the turbo write area SLC. The use of the turbo write area SLC of 3 GB, which is configured with SLCs, causes a decrease in capacity of 12 GB in the normal area QLC which is configured with QLCs. The third storage state (c) may be a state in which a storage area of 3 GB is additionally allocated as the turbo write area SLC, and then a storage area of the third storage state (c) includes a normal area QLC of 68 GB and a turbo write area SLC of 8 GB.

Because the turbo write area SLC is an area which a user cannot access, the user may recognize that the remaining capacity of the storage device sequentially decreases from 100 GB in the initial state (a), to 80 GB in the second storage state (b), and then to 68 GB in the third storage state (c), even though the amount of actually stored data is 8 GB. The reduction mode has an advantage in that the user can access a total capacity of the storage device according to the maximum number of bits that may be stored in each cell of the storage device when the turbo write area SLC is not used.

Figure 4:
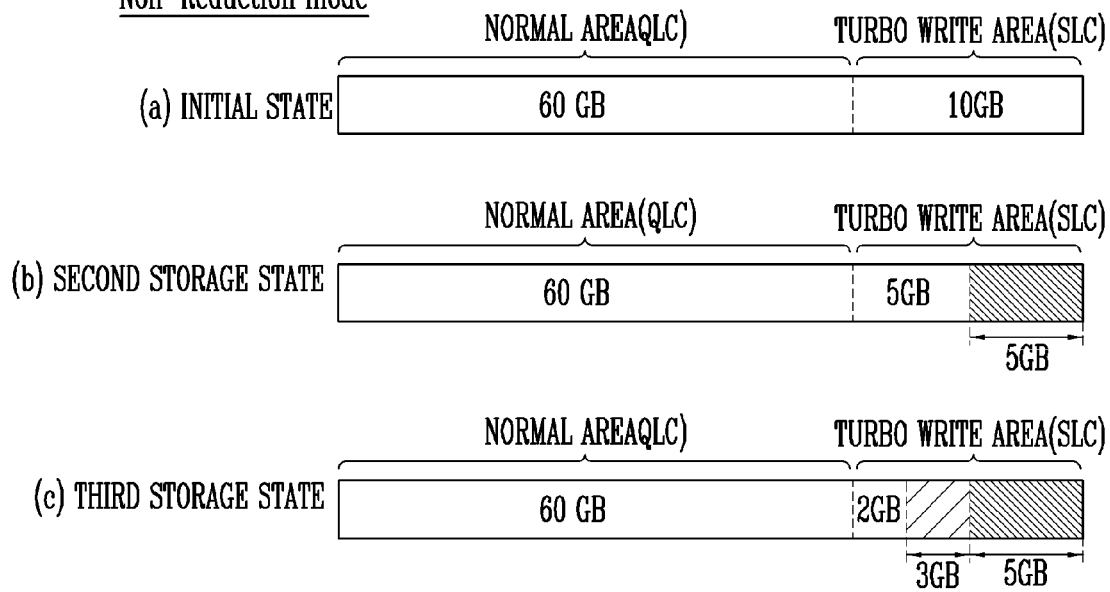
FIG. 4 illustrates a non-reduction mode according to an embodiment.

FIG. 4 is a diagram illustrating a non-reduction mode.

Referring to FIG. 4, the host may use a turbo write function in a non-reduction mode through communication with the storage device. The non-reduction mode may be a mode in which the turbo write area SLC is allocated in advance. The host may request the storage device to use, for example, a turbo write area of 10 GB in the non-reduction mode. The storage device may allocate a turbo write area SLC of 10 GB in advance. When the host requests the storage device to store data in the turbo write area SLC, the corresponding data may be stored in a portion of a turbo write area SLC corresponding to 10 GB allocated in advance.

Specifically, a storage area of an initial (first) state (a) may be configured with a normal area QLC of 60 GB and a turbo write area SLC of 10 GB. In a turbo write operation, data is stored in a portion of the turbo write area SLC allocated in advance, and therefore, the capacity of the normal area QLC may not be affected. That is, in the non-reduction mode, the capacity of the normal area QLC can be held constant, even when data is stored in the turbo write area SLC.

A second storage state (b) represents a state in which write data corresponding to 5 GB is stored in the turbo write area SLC. The second storage state (b) may be a state in which 5 GB of data is stored in the turbo write area SLC, and then a storage area of the second storage state (b) still includes the normal area QLC of 60 GB and the turbo write area of 10 GB. In the second storage state (b), the storage device may additionally receive, from the host, a write request for requesting the storage device to store write 3 GB of data in the turbo write area SLC, resulting in the state changing to a third storage state (c).

The third storage state (c) represents a state in which write data corresponding to 3 GB is additionally stored in the turbo write area SLC. The third storage state (c) may be a state in which the 3 GB of data is additionally stored in the turbo write area SLC, and then a storage area of the third storage state (c) still includes the normal area QLC of 60 GB and the turbo write area of 10 GB.

As the 8 GB of data are stored in the turbo write area SLC, a user may recognize that the remaining capacity of the storage device sequentially decreases by the amount of data stored: from 70 GB in the initial state (a), to 65 GB in the second storage state (b), and to 62 GB in the third storage state (c). That is, in the non-reduction mode, the turbo write area is allocated in advance to be used, and thus the user can recognize that the surplus capacity of the storage device decreases by the amount of data stored in the turbo write area.

Figure 5:
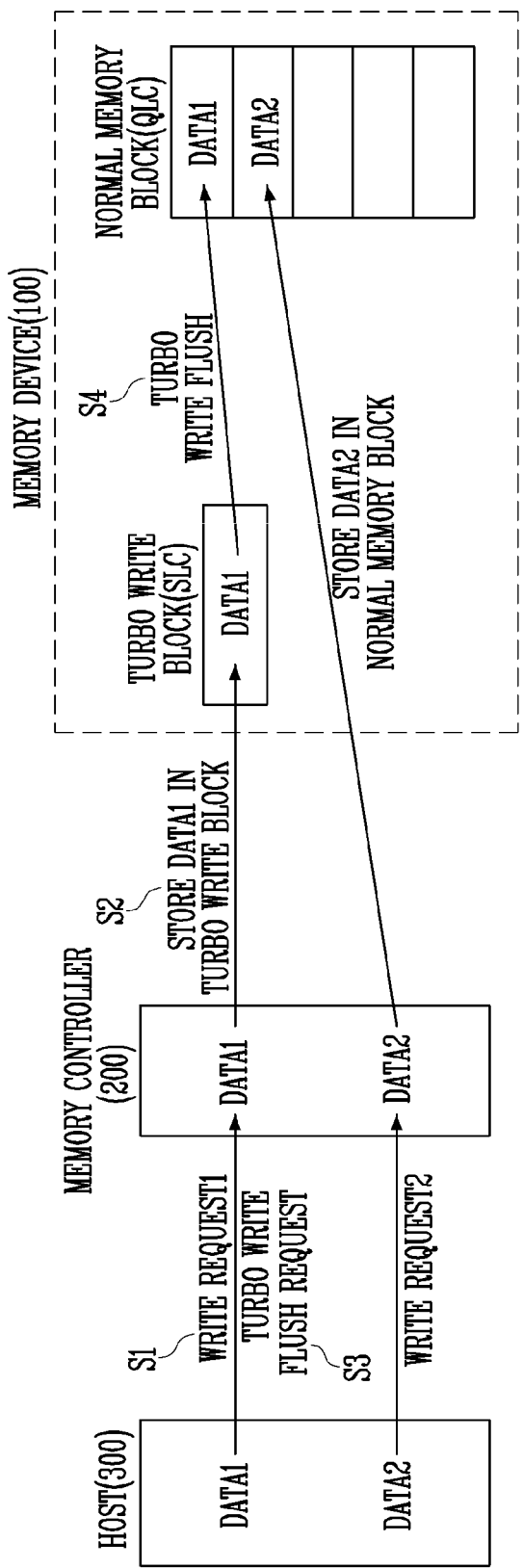
FIG. 5 illustrates a turbo write function in accordance with an embodiment of the present disclosure.

FIG. 5 is a illustrates a turbo write function in accordance with an embodiment of the present disclosure.

Referring to FIG. 5, the host 300 may provide the memory controller 200 with a plurality of write requests (write request1 and write request2) and write data DATA1 and DATA2 corresponding thereto.

In an embodiment, each of the write requests (write request1 and write request2) may include turbo write mode information. The turbo write mode information may be information indicating whether write data corresponding to the write request is to be stored in a turbo write block SLC. For example, the turbo write mode information in a set state may indicate that the write data is to be stored in a turbo write block SLC. Alternatively, the turbo write mode information in a reset state may indicate that the write data is to be stored in a normal memory block QLC.

In an embodiment, the host 300 may provide a turbo write flush request to the memory controller 200. Data stored in a turbo write block SLC according to the turbo write flush request may be moved to another turbo write bock SLC among a plurality of turbo write blocks SLC or may be moved to the normal memory block QLC.

The memory controller 200 may receive, from the host 300, write request1 and first write data DATA1 corresponding thereto (S1). The memory controller 200 may determine that the turbo write mode information is in the set state from the write request1. Accordingly, the first write data DATA1 corresponding to the write request1 may be stored in a turbo write block SLC of the memory device 100 (S2). Subsequently, the memory controller 200 may receive, from the host 300, a turbo write flush request for the first write data DATA1 stored in the turbo write block SLC in order to empty the turbo write block SLC (S3). In response to the turbo write flush request, the memory controller 200 may cause the performance of a turbo write flush operation that moves the first write data DATA1 stored in the turbo write block SLC into the normal memory block QLC (S4). In an embodiment, the turbo write block SLC may then be erased.

The memory controller 200 may receive, from the host 300, write request2 and second write data DATA2 corresponding thereto. The memory controller 200 may determine that the turbo write mode information is in the reset state from the write request2. Therefore, the second write data DATA2 corresponding to the write request2 may be stored in the normal memory block QLC of the memory device 100. The second write data DATA2 may be directly stored in the normal memory block QLC without passing through any turbo write block SLC according to the write request of the host 300. Therefore, a turbo write flush operation on the second write data DATA2 may be omitted.

The turbo write block SLC in accordance with the embodiment shown in FIG. 5 may be configured with only an SLC. Therefore, the write request in accordance with the embodiment shown in FIG. 5 may not include turbo write block information as information indicating which turbo write block among a plurality of turbo write blocks the data is to be stored in.

Figure 6:
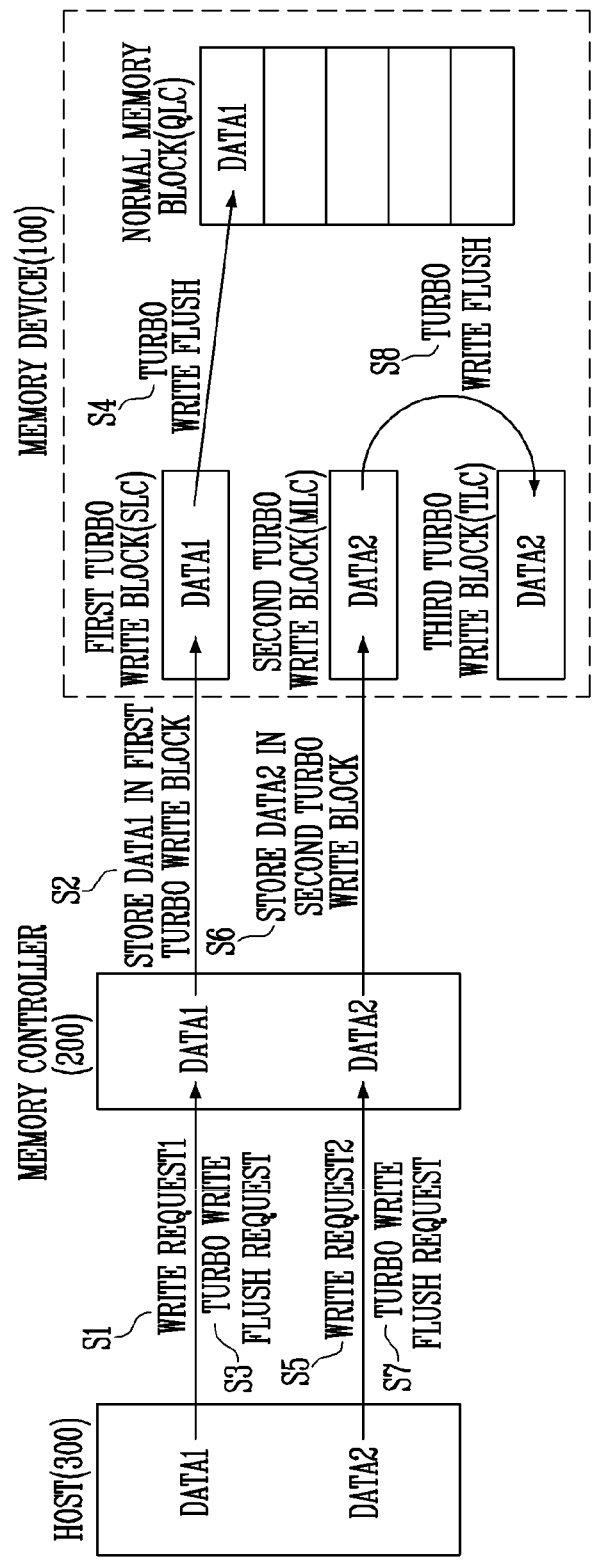
FIG. 6 illustrates a turbo write function in accordance with another embodiment of the present disclosure.

FIG. 6 is a device diagram illustrating a turbo write function in accordance with another embodiment of the present disclosure.

As compared with FIG. 5, turbo write blocks shown in FIG. 6 may include multi-level turbo write blocks. For example, the memory device 100 may be configured with first to third turbo write blocks. The first turbo write block SLC may be configured with SLCs each storing one data bit, the second turbo write block MLC may be configured to MLCs each storing two data bits, and the third turbo write block TLC may be configured with TLCs each storing three data bits.

A write request in accordance with the embodiment shown in FIG. 6 may additionally include turbo write block information in addition to turbo write mode information. The turbo write block information may be information indicating a turbo write block in which write data is to be stored among a plurality of turbo write blocks. Specifically, the write request may include information indicating a block in which write data is to be stored among the first turbo write block SLC, the second turbo write block MLC, and the third turbo write block TLC. That is, in an embodiment in which a plurality of turbo write blocks are provided, and the respective number of bits stored in each cell varies among the turbo write blocks, a write request to store data in a turbo write block may include an indication of a number of bits per cell, and the turbo write block used to store the data corresponding to that write request may be selected from among turbo write blocks using the indicated number of bits per cell to store data.

In an embodiment, the memory controller 200 may receive, from the host 300, write request1 and first write data DATA1 (S1). The memory controller 200 may determine, from the write request1, turbo write mode information in a set state and turbo write block information designating the first turbo write block SLC. The first write data DATA1 may be stored in the first turbo write block SLC of the memory device 100 (S2). Subsequently, the memory controller 200 may receive, from the host, a turbo write flush request requesting that the first write data DATA1 stored in the first turbo write block SLC be moved to a normal memory block QLC (S3). In response to the turbo write flush request, the memory controller 200 may cause the performance of a turbo write flushing operation that moves the first write data DATA1 stored in the first turbo write block SLC into the normal memory block QLC (S4).

In an embodiment, the memory controller 200 may receive, from the host 300, write request2 and second write data DATA2 corresponding thereto (S5). The memory controller 200 may determine, from the write request2, turbo write mode information in a set state and turbo write block information designating the second turbo write block MLC. The second write data DATA2 may be stored in the second turbo write block MLC of the memory device 100 (S6). Subsequently, the memory controller 200 may receive, from the host 300, a turbo write flush request requesting that the second write data DATA2 stored in the second turbo write block MLC be moved to the third turbo write block TCL (S7). In response to the turbo write flush request, the memory controller 200 may cause the performance of a turbo write flush operation that moves the second write data DATA2 stored in the second turbo write block MLC to the third turbo write block TCL (S8).

The turbo write flush operation shown in FIG. 6 may be performed even between two or more turbo write blocks including memory cells storing different numbers of data bits. In an embodiment, data may be moved to another turbo write block from at least one turbo write block among the first turbo write block SLC, the second turbo write block MLC, and the third turbo write block TLC. As a number of data bits which can be stored by a memory cell increases, the time required to store data in the corresponding memory cell may be increased. Memory cells included in the turbo write block may store a number of data bits, which is smaller than a number of data bits of memory cells included in the normal memory block QLC. Thus, in the second turbo write flush operation (S8) shown in FIG. 6, data is moved to the turbo write block TLC instead of the normal memory block QLC, so that the speed of the turbo write flush operation can be increased.

Figure 7:
FIG. 7 illustrates a write request in accordance with an embodiment of the present disclosure.

FIG. 7 is a diagram illustrating a write request in accordance with an embodiment of the present disclosure.

Referring to FIG. 7, a write command, turbo write mode information, and turbo write block information may be included in a write request provided by the host. The write command may be a command through which the host requests the memory controller to perform an operation corresponding to the write request.

The turbo write mode information may be information indicating whether write data corresponding to the write request is to be stored in a turbo write block. For example, the turbo write mode information in a set state may indicate that the write data is to be stored in a turbo write block. Alternatively, the turbo write mode information in a reset state may indicate that the write data is to be stored in a normal memory block.

In an embodiment, when the turbo write mode information is set to '1,' a turbo write mode may be in the set state, and when the turbo write mode information is set to '0,' the turbo write mode may be in the reset state. However, in another embodiment, when the turbo write mode information is set to '1,' the turbo write mode may be in the reset state, and when the turbo write mode information is set to '0,' the turbo write mode may be in the set state.

The turbo write block information may be information indicating a turbo write block in which the write data is to be stored among a plurality of turbo write blocks. The turbo write block information may include information on a number of data bits which can be stored by a memory cell included in the turbo write block in which the write data is to be stored.

For example, the turbo write block information may include information designating at least one block among a first turbo write block configured with SLCs, a second turbo write block configured with MLCs, and a third turbo write block configured with TLCs. When the turbo write block information designates the first turbo write block, the write data may be stored in the first turbo write block. When the turbo write block information designates the second turbo write block, the write data may be stored in the second turbo write block. When the turbo write block information designates the third turbo write block, the write data may be stored in the third turbo write block.

Figure 8:
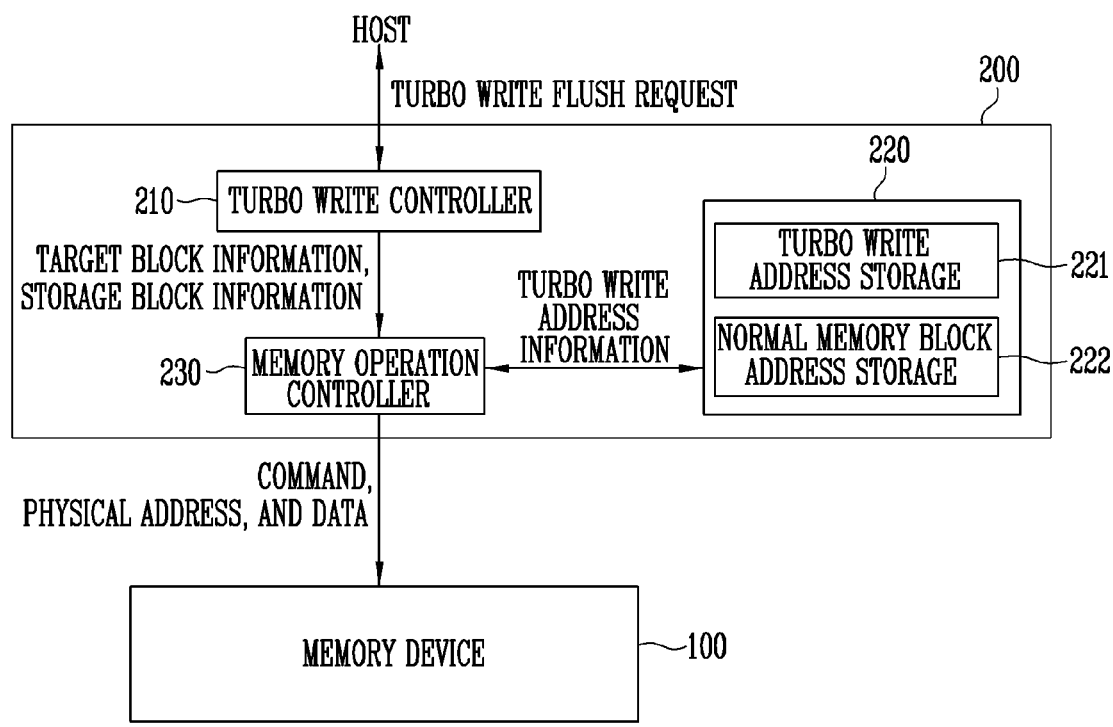
FIG. 8 illustrates a turbo write flush operation according to an embodiment.

FIG. 8 illustrates in detail the turbo write flush operation.

Referring to FIG. 8, the memory controller 200 may include a turbo write controller 210, a map data storage 220, and a memory operation controller 230.

The turbo write controller 210 may determine target block information and storage block information from a turbo write flush request received from the host. Specifically, the turbo write controller 210 may determine the target block information and the storage block information by decoding the turbo write flush request. The turbo write controller 210 may provide the memory operation controller 230 with the determined target block information and the determined storage block information.

The map data storage 220 may include a turbo write address storage 221 and a normal memory block address storage 222. The turbo write address storage 221 may include turbo write address information indicating a physical address of a turbo write block. Specifically, the turbo write address information may be information on a physical address of free blocks among turbo write blocks. The free block is a block in which there exists a page which has not yet been programmed, and may be a block in a state in which the block can have data stored into it.

The normal memory block address storage 222 may include information on a physical address of a normal memory block. Specifically, the normal memory block address storage 222 may include information on a physical address of free blocks among normal memory blocks.

When the turbo write operation or the turbo write flush operation is performed, all pages of a block which was previously determined as a free block may have data written in them. In this case, the block which was previously determined as the free block may no longer be a free block. Therefore, the map data storage 220 may update the turbo write address information therein whenever the turbo write operation or the turbo write flush operation is performed.

The memory operation controller 230 may determine an address of a target block as a memory block on which the turbo write flush operation is to be performed, based on the target block information included in the turbo write flush request. The memory operation controller 230 may determine an address of a storage block as a memory block to which data stored in the target block is to be moved, based on the storage block information included in the turbo write flush request.

In response to the turbo write flush request, the memory operation controller 230 may control the memory device 100 to read data stored in the target block and store the read data in the storage block.

The memory operation controller 230 may provide the memory device 100 with a physical address of a block corresponding to the target block information, the storage block information, or both, based on the turbo write address information. Also, the memory operation controller 230 may provide the memory device 200 with a command and data, which are necessary for the turbo write flush operation. The data may be the data previously read from of the target block.

Figure 9:
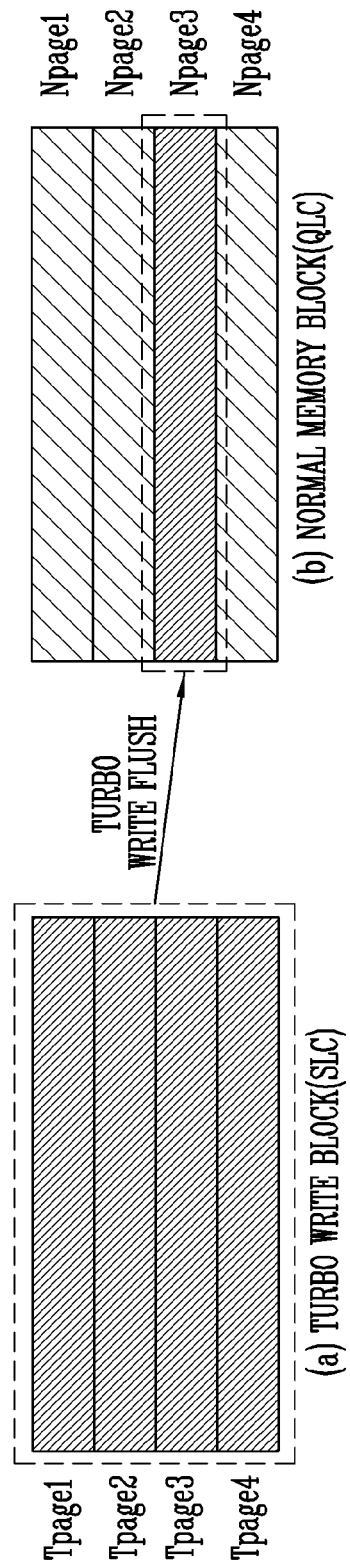
FIG. 9 illustrates a turbo write flush operation in accordance with an embodiment of the present disclosure.

FIG. 9 illustrates a turbo write flush operation in accordance with an embodiment of the present disclosure.

Referring to FIG. 9, a plurality of memory blocks may be configured as a turbo write block SLC and a normal memory block QLC. The turbo write block SLC may be configured with SLCs storing one data bit each. The normal memory block QLC may be configured with QLCs storing four data bits each. However, embodiments are not limited thereto, and in some embodiments, the turbo write block SLC and the normal memory block QLC may be configured with memory cells storing various other numbers of data bits.

Referring to FIG. 9, a turbo write flush operation may be performed in response to a turbo write flush request received from the host. The turbo write flush operation may be an operation in which data indicated by slash lines is moved from the turbo write block SLC to the normal memory block QLC. The host may recognize a remaining storage area of the turbo write block. When the host determines that remaining storage area does not exist in the turbo write block, the host may provide a turbo write flush request for the turbo write block to the storage device. The storage device may move data stored in the turbo write block SLC to the normal memory block QLC in response to the turbo write flush request. Data stored in four pages of a block configured with an SLC may be stored in one page of a block configured with a QLC. Therefore, data respectively stored in four pages Tpage1, Tpage2, Tpage3, and Tpage4 of the turbo write block SLC may be moved to one page Npage3 of the normal memory block QLC.

In an embodiment, since remaining storage area does not exist in the turbo write block SLC, no turbo write operations can be performed until the turbo write flush operation has completed. Therefore, decreasing the time required to perform the turbo write flush operation may be important for decreasing the delay time of a response to the write request of the host. As a number of data bits which can be stored in a memory cell increases, the time required to store data in the that memory cell may be increased. Therefore, a time required to store data in the normal memory block QLC configured with a QLC may be longer than a time required to store the data in a memory block configured with an MLC or TLC. Hereinafter, an embodiment for decreasing a delay time of the turbo write flush operation will be described with reference to FIG. 10.

Figure 10:
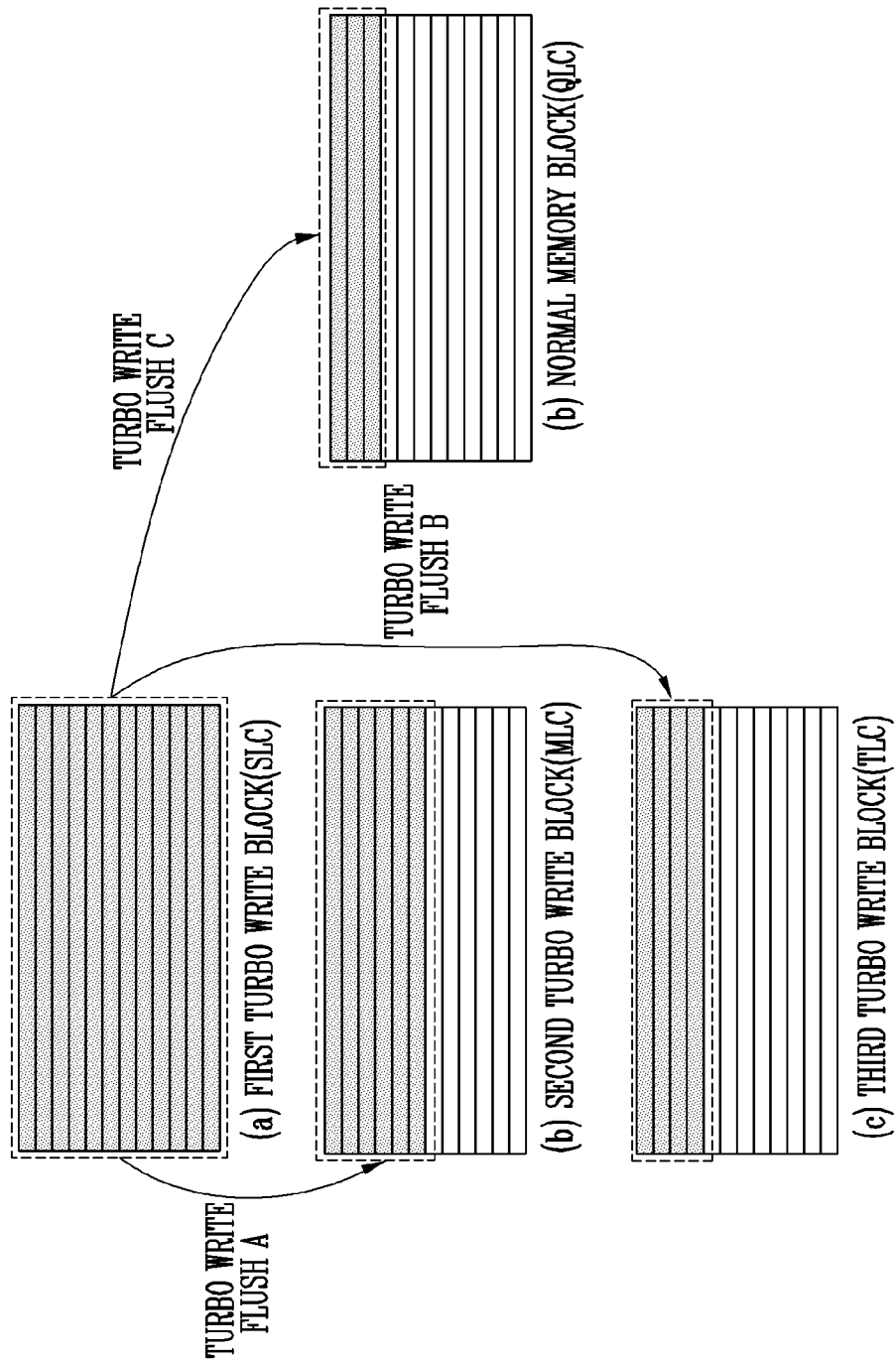
FIG. 10 illustrates a turbo write flush operation in accordance with another embodiment of the present disclosure.

FIG. 10 is a diagram illustrating a turbo write flush operation in accordance with another embodiment of the present disclosure.

As compared with FIG. 9, turbo write blocks shown in FIG. 10 may include multi-level turbo write blocks. Numbers of data bits which can be stored by memory cells included in the respective turbo write blocks may be different from each other. For example, the turbo write blocks may include at least one of a first turbo write block SLC configured with an SLC, a second turbo write block MLC configured with an MLC, and a third turbo write block TLC configured with a TLC. However, in some embodiments, the number of data bits which can be stored by memory cells included in the respective turbo write blocks are not limited thereto.

Referring to FIG. 10, the host may provide the memory controller with a turbo write flush request for emptying out data stored in the first turbo write block SLC. In response to the turbo write flush request, the memory controller may move the data stored in the first turbo write block SLC to another turbo write block or a normal memory block QLC.

Target block information and storage block information may be included in the turbo write flush request. The target block information may include information on a turbo write block to be emptied. In the example shown in FIG. 10, a block corresponding to the target block information may be the first turbo write block SLC.

The storage block information may include information on a block in which data moved in accordance with a turbo write flush operation is to be stored. For example, when the storage block information corresponds to the second turbo write block MLC, a turbo write flush A operation may be performed, in which data stored in the first turbo write block SLC is moved to the second turbo write block MLC. When the storage block information corresponds to the third turbo write block TLC, a turbo write flush B operation may be performed, in which the data stored in the first turbo write block SLC is moved to the third turbo write block TLC. When the storage block information corresponds to the normal memory block QLC, a turbo write flush C operation may be performed, in which the data stored in the first turbo write block SLC is moved to the normal memory block QLC.

As compared with FIG. 9, the turbo write flush operation shown in FIG. 10 may be performed even between two or more turbo write blocks including memory cells storing different respective numbers of data bits. In an embodiment, data may be moved to another turbo write block from at least one turbo write block among the first turbo write block SLC, the second turbo write block MLC, and the third turbo write block TLC. As described above, as a number of data bits which can be stored in a memory cell increases, the time required to store data in the corresponding memory cell may be lengthened. Thus, as compared with the embodiment shown in FIG. 9, data may be moved to the turbo write block instead of to the normal memory block QLC, so that the speed of the turbo write flush operation can be increased. In the embodiment shown in FIG. 10, the fastest turbo write flush operation may be the turbo write flush A operation, the next fastest may be the turbo write flush B operation, and slowest may be the turbo write flush C operation.

Figure 11:
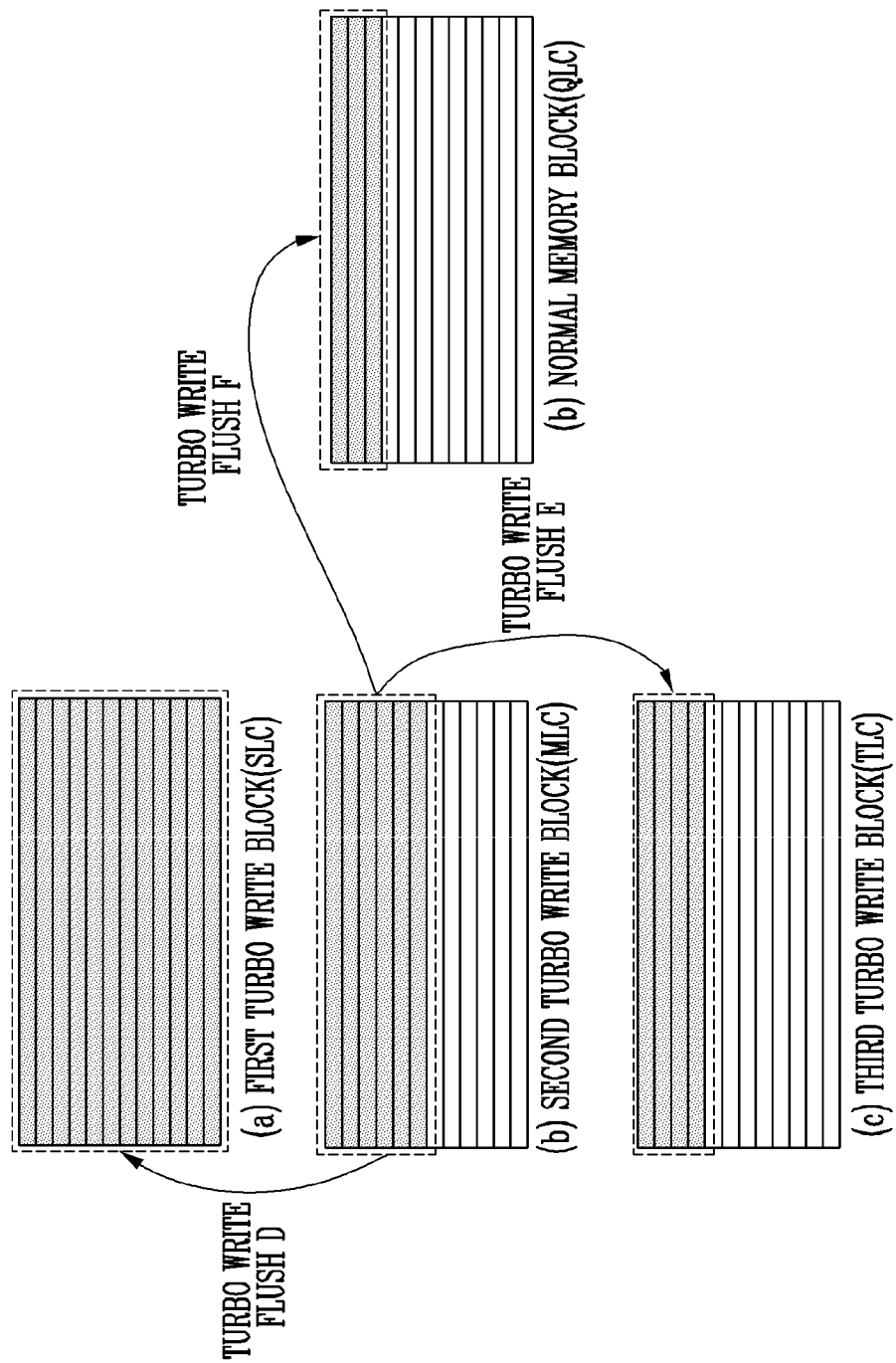
FIG. 11 illustrates a turbo write flush operation in accordance with another embodiment of the present disclosure.

FIG. 11 is a diagram illustrating a turbo write flush operation in accordance with another embodiment of the present disclosure.

Referring to FIG. 11, the host may provide the memory controller with a turbo write flush request for emptying out data stored in the second turbo write block MLC. In response to the turbo write flush request, the memory controller may move the data stored in the second turbo write block MLC to another turbo write block or to the normal memory block QLC.

Target block information and storage block information may be included in the turbo write flush request. The target block information may include information on a turbo write block to be emptied. In the example of FIG. 11, a block corresponding to the target block information may be the second turbo write block MLC.

The storage block information may include information on a block in which data moved according to a turbo write flush operation is to be stored. For example, when the storage block information corresponds to the first turbo write block SLC, a turbo write flush D operation may be performed, in which data stored in the second turbo write block MLC is moved to the first turbo write block SLC. When the storage block information corresponds to the third turbo write block TLC, a turbo write flush E operation may be performed, in which the data stored in the second turbo write block MLC is moved to the third turbo write block TLC. When the storage block information corresponds to the normal memory block QLC, a turbo write flush F operation may be performed, in which the data stored in the second turbo write block MLC is moved to the normal memory block QLC.

In an embodiment, the turbo write flush operation may also be performed even between two or more turbo write blocks including memory cells storing different numbers of data bits. Thus, as compared with the embodiment shown in FIG. 9, data is moved to the turbo write block instead of the normal memory block QLC, so that the speed of the turbo write flush operation can be increased. In the example of FIG. 11, the fastest turbo write flush operation may be the turbo write flush D operation, the next fastest may be the turbo write flush E operation, and the slowest may be the turbo write flush F operation.

FIG. 12 is a diagram illustrating a turbo write flush request in accordance with an embodiment of the present disclosure.

Referring to FIG. 12, the turbo write flush request may include a turbo write flush command, target block information, and storage block information. The turbo write flush command may be a command through which the host requests the memory controller to perform a turbo write flush operation.

The target block information may include information on a turbo write block to be emptied. The host may directly designate a target block. Data stored in the target block designated by the host may be moved to another turbo write block or to a normal memory block, in response to the turbo write flush request including the target block information.

The target block information may include information on a number of data bits which can be stored by memory cells included in a turbo write block to be emptied by the turbo write flush operation. For example, when the target block information designates a first turbo write block configured with an SLC, data stored in the first turbo write block may be emptied. When the target block information designates a second turbo write block configured with an MLC, data stored in the second turbo write block may be emptied. Similarly, when the target block information designates a third turbo write block configured with a TLC, data stored in the third turbo write block may be emptied.

The storage block information may include information on a block into which data to be moved by the turbo write flush operation is to be stored. Specifically, the storage block information may include information on a number of data bits which can be stored by each of memory cells included in a block into which data is to be stored by the turbo write flush operation. For example, when the storage block information designates a first turbo write block configured with an SLC, data may be moved to the first turbo write block. When the storage block information designates a second turbo write block configured with an MLC, data may be moved to the second turbo write block. Similarly, when the storage block information designates a third turbo write block configured with a TLC, data may be moved to the third turbo write block.

FIG. 13 is a diagram illustrating a configuration of the turbo write address storage shown in FIGS. 2 and 8.

Referring to FIG. 13, the turbo write address storage may include turbo write address information indicating a physical address of a turbo write block. Specifically, the turbo write address information may indicate a physical address of free blocks among turbo write blocks. The free block is a block in which there exists a page which has not yet been programmed, and may be a block in a state in which data can be stored into the block.

In an embodiment, the memory controller may receive a write request including turbo write mode information in a set state. The memory controller may determine a physical address of a turbo write block corresponding to turbo write block information, based on the turbo write address information. Also, the memory controller may determine a physical address of a target block and a storage block, based on the turbo write address information, in response to the turbo write flush request.

The turbo write address information may be information in which different physical addresses respectively correspond to turbo write blocks. Two or more turbo write blocks configured with memory cells having the same number of data bits per cell may exist. Therefore, even when the memory cells included in the respective turbo write blocks are able to store the same number of data bits, different physical addresses may correspond to the respective turbo write blocks.

Referring to FIG. 13, memory cells included in a first turbo write block TWB1 may be configured as SLCs each storing one data bit. The first turbo write block TWB1 may correspond to a first physical address ADDR1. Memory cells included in a second turbo write block TWB2 may be configured as MLCs each storing two data bits. The second turbo write block TWB2 may correspond to a second physical address ADDR2. Memory cells included in a third turbo write block TWB3 may be configured as TLCs each storing three data bits. The third turbo write block TWB3 may correspond to a third physical address ADDR3. Memory cells included in a fourth turbo write block TWB4 may be configured with MLCs each storing two data bits. The fourth turbo write block TWB4 may correspond to a fourth physical address ADDR4. Memory cells included in a kth turbo write block TWBk may be configured as TLCs each storing three data bits. The kth turbo write block TWBk may correspond to a kth physical address ADDRk.

Figure 14:
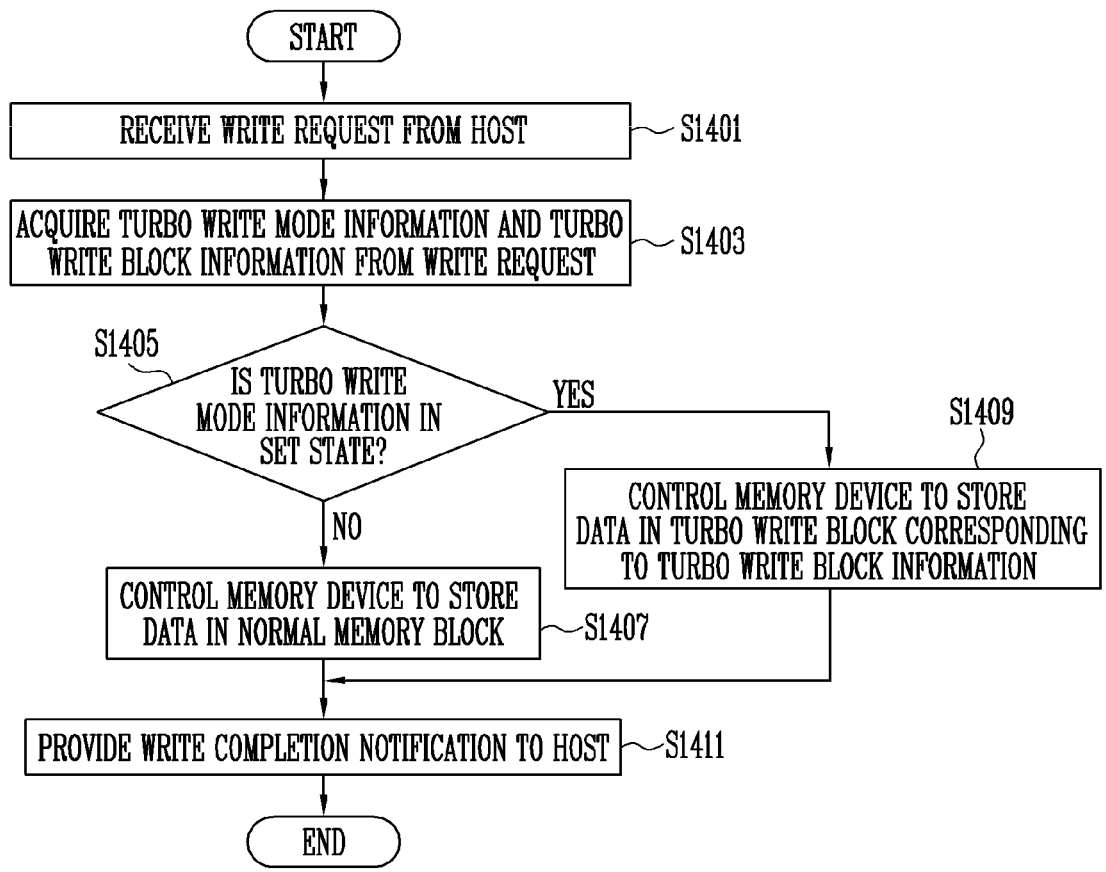
FIG. 14 illustrates an operation of the memory controller in accordance with an embodiment of the present disclosure.

FIG. 14 is a flowchart illustrating an operation of a memory controller in accordance with an embodiment of the present disclosure.

Referring to FIG. 14, in step S1401, the memory controller receives a write request from the host.

In step S1403, the memory controller may determine turbo write mode information and turbo write block information by decoding the received write request. The turbo write mode information may be information indicating whether write data corresponding to the write request is to be stored in a plurality of turbo write blocks.

The turbo write block information may be information on a turbo write block in which the write data is to be stored among the plurality of turbo write blocks.

In step S1405, the memory controller may determine whether the turbo write mode information is in a set state. When the turbo write mode information is in the set state, the write data corresponding to the write request may be stored in the turbo write block. When the turbo write mode information is in a reset state, the write data may be stored in a normal memory block.

When the turbo write mode is in the set state, step S1409 may be performed. When the turbo write mode is in the reset state, step S1407 may be performed.

In the step S1407, the memory controller may control the memory device to store the data in the normal memory block. When turbo write mode information included in the write request is the turbo write mode information in the reset state, the memory controller may determine a physical address at which the write data is to be stored as a physical address of the normal memory block. The memory controller may provide the memory device with a program command instructing the memory device to store the data in the normal memory block. Also, the memory controller may provide the memory device with the determined physical address and the write data.

In the step S1409, the memory controller may control the memory device to store the data in a turbo write block corresponding to the turbo write block information. The memory controller may determine a physical address of the turbo write block in which the write data is to be stored, based on the turbo write block information.

The memory controller may provide the memory device with a program command instructing the memory device to store the data in the turbo write block corresponding to the turbo write block information. Also, the memory controller may provide the memory device with the determined physical address and the write data.

In step S1411, the memory controller may complete a write operation corresponding to the write request received from the host, and provide a write completion notification to the host.

Figure 15:
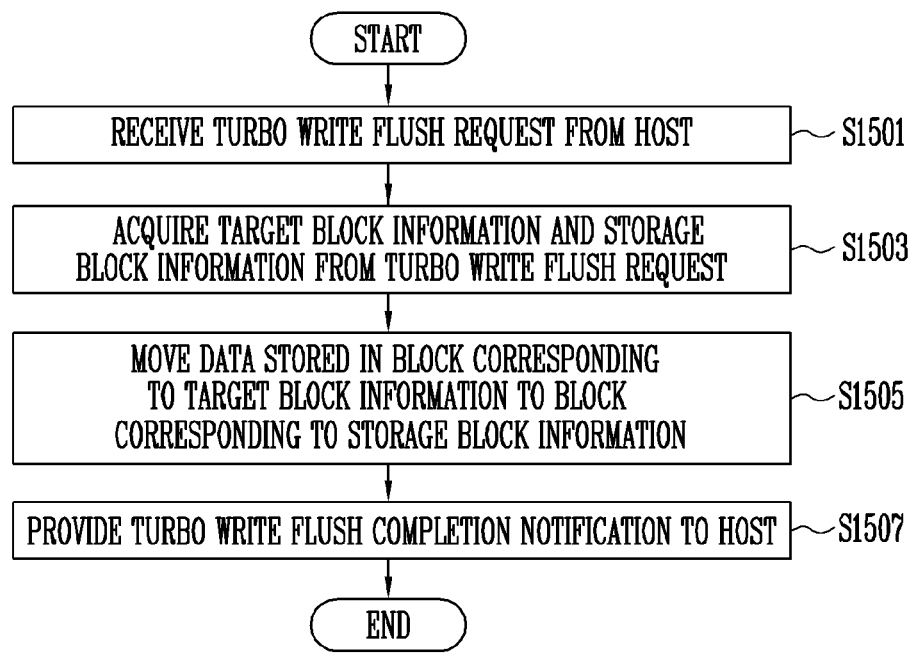
FIG. 15 illustrates an operation of the memory controller in accordance with another embodiment of the present disclosure.

FIG. 15 is a flowchart illustrating an operation of the memory controller in accordance with another embodiment of the present disclosure.

Referring to FIG. 15, in step S1501, the memory controller may receive a turbo write flush request from the host.

In step S1503, the memory controller may determine target block information and storage block information by decoding the turbo write flush request.

The target block information may include information on a number of data bits which can be stored by a memory cell included in a turbo write block on which a turbo write flush operation is to be performed. The storage block information may include information on a memory block in which data is to be stored by the turbo write flush operation. Specifically, the storage block information may include information on a number of data bits which can be stored by a memory cell included in the memory block in which the data is to be stored by the turbo write flush operation.

In step S1505, the memory controller may control the memory device to move data stored in a block corresponding to the target block information to a block corresponding to Hail storage block information. The memory controller may determine a physical address of a target block as a memory block on which the turbo write flush operation is to be performed, based on the target block information included in the turbo write flush request. The memory controller may determine a physical address of the storage block as a memory block to which data stored in the target block is to be moved, based on the storage block information included in the turbo write flush request.

The memory controller may control the memory device to read the data stored in the target block and store the read data in the storage block, in response to the turbo write flush request.

In step S1507, the memory controller may complete the turbo write flush operation, and provide a turbo write flush completion notification to the host.

Figure 16:
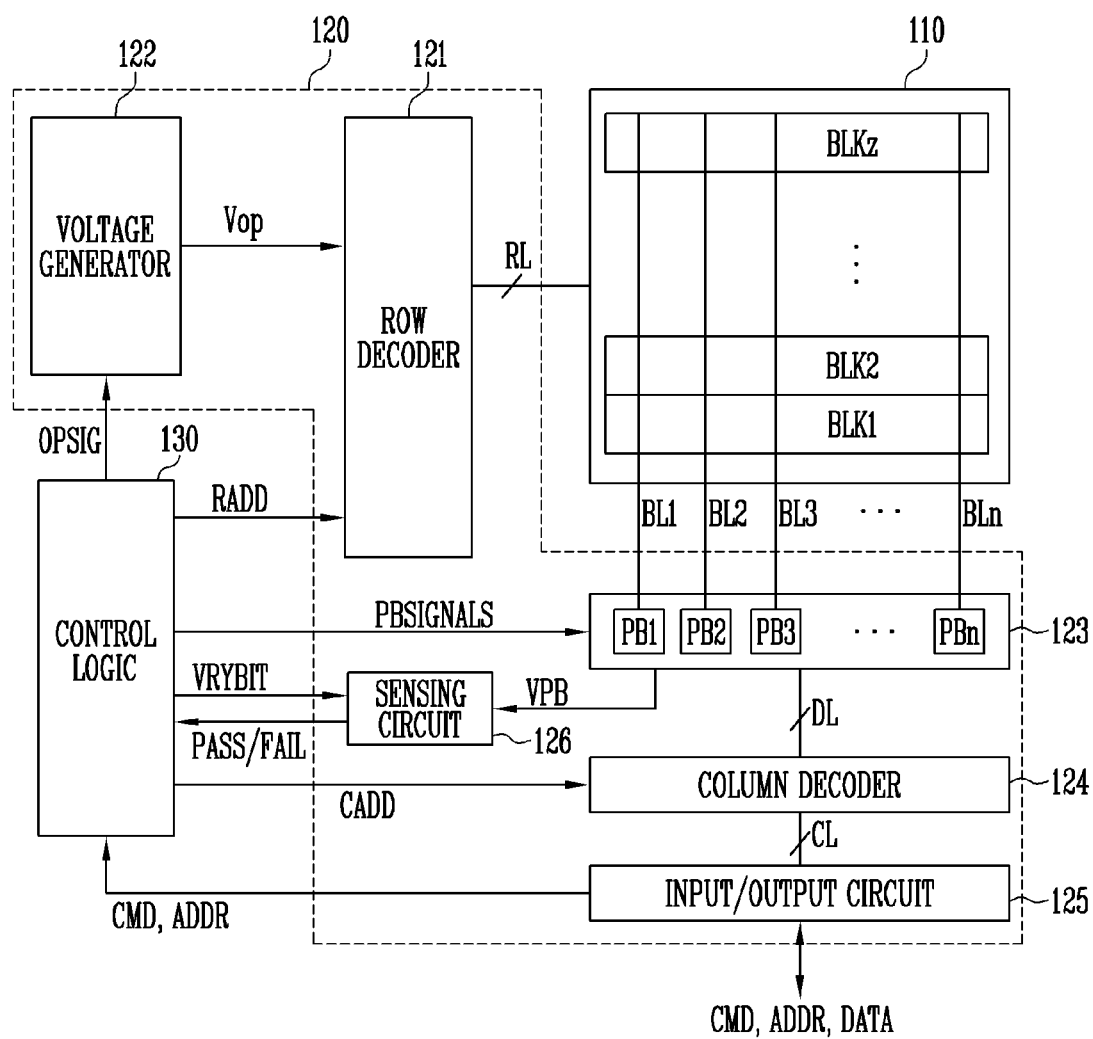
FIG. 16 illustrates a structure of a memory device shown in FIG. 1.

FIG. 16 is a diagram illustrating a structure of the memory device 100 shown in FIG. 1.

The memory device 100 may include a memory cell array 100, a peripheral circuit 120, and a control logic 130.

The memory cell array 110 includes a plurality of memory blocks BLK1 to BLKz. The plurality of memory blocks BLK1 to BLKz are coupled to a row decoder 121 through row lines RL. The plurality of memory blocks BLK1 to BLKz are coupled to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, the voltage generator 122, the page buffer group 123, a column decoder 124, and an input/output circuit 125.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 operates under the control of the control logic 130. The row decoder 121 receives a row address RADD from the control logic 130.

The row decoder 121 decodes the row address RADD. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines. In a read operation, the row decoder 121 may apply a read voltage to the selected word line, and apply a read pass voltage having a level higher than that of the read voltage to the unselected word lines.

In an embodiment, an erase operation of the memory device 100 is performed in a unit of a memory block. In the erase operation, the row decoder 121 may select one memory block according to the decoded address. In the erase operation, the row decoder 121 may apply a ground voltage to word lines coupled to the selected memory blocks.

The voltage generator 122 operates under the control of the control logic 130. The voltage generator 122 generates a plurality of voltages by using an external power voltage supplied to the memory device 100. Specifically, the voltage generator may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to nth page buffers PB1 to PBn. The first to nth page buffers PB1 to PBn are coupled to the memory cell array 110 respectively through first to nth bit lines BL1 to BLn. The first to nth bit lines BL1 to BLn operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense voltages or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program pulse is applied to a selected word line. Memory cells of a selected page are programmed according to the transferred data DATA. A memory cell coupled to a bit line to which a program allow voltage (e.g., a ground voltage) is applied may have an increased threshold voltage. A threshold voltage of a memory cell coupled to a bit line to which a program inhibit voltage (e.g., a power voltage) is applied may be maintained. In a program verify operation, the first to nth page buffers PB1 to PBn read page data from the selected memory cells through the first to nth bit lines BL1 to BLn.

In a read operation, the first to nth page buffers PB1 to PBn read data DATA from the memory cells of the selected page through the first to nth bit lines BL1 to BLn, and outputs the read data DATA to the input/output circuit 125 under the control of the column decoder 124.

In an erase operation, the first to nth page buffers PB1 to PBn may float the first to nth bit lines BL1 to BLn.

The column decoder 124 may communicate data between the input/output circuit 125 and the page buffer group 123 in response to a column address CADD. For example the column decoder 124 may communicate data with the first to nth page buffers PB1 to PBn through data lines EL, or communicate data with the input/output circuit 125 through column lines CL.

The input/output circuit 125 may transfer a command CMD and an address ADDR, which are received from the memory controller 200 described with reference to FIG. 2, to the control logic 130, or exchange data DATA with the column decoder 124.

In a read operation or verify operation, a sensing circuit 126 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass or fail signal PASS/FAIL.

Figure 17:
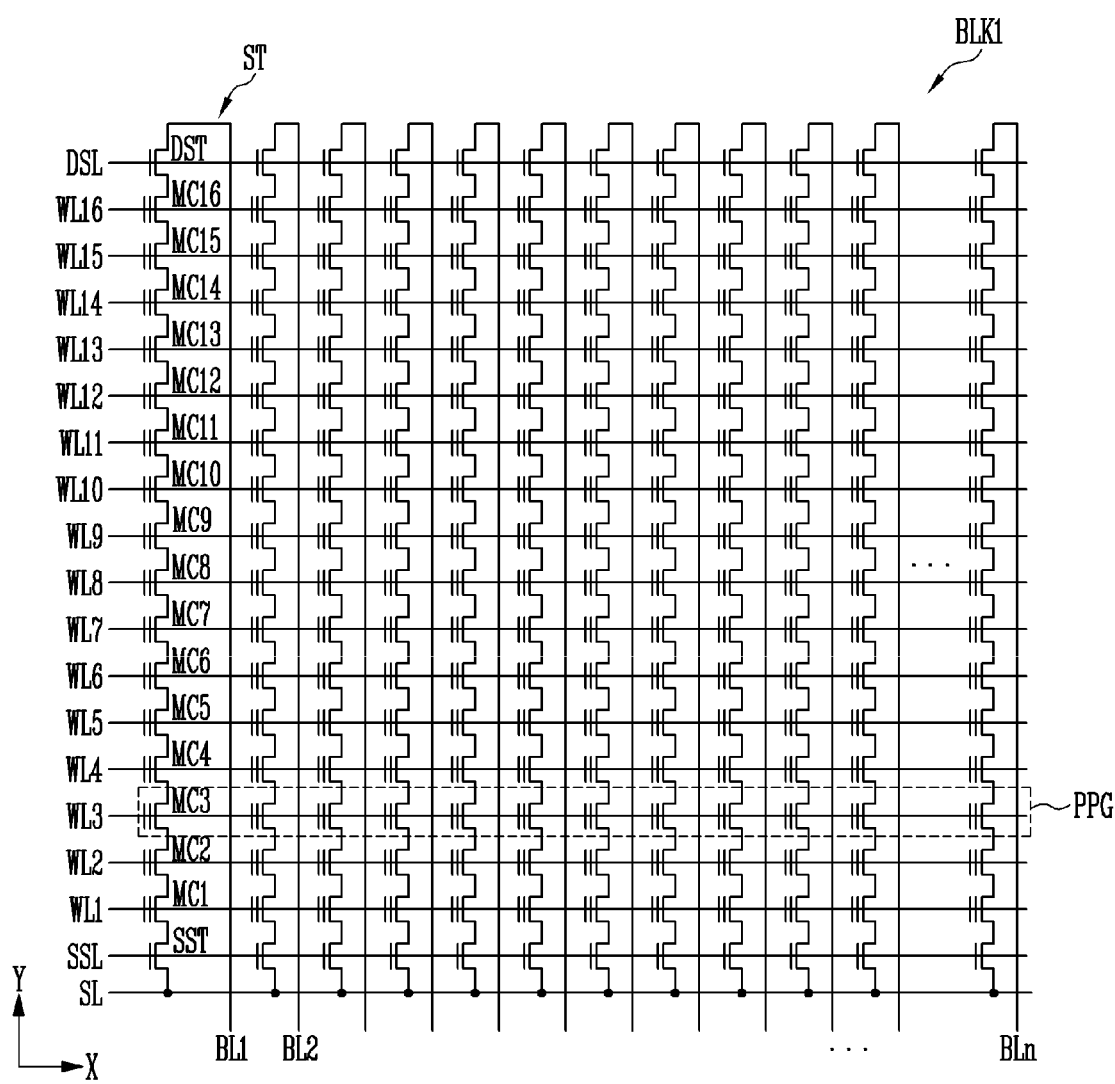
FIG. 17 illustrates a structure of any one memory block among memory blocks shown in FIG. 16.

FIG. 17 is a diagram illustrating a structure of any one memory block BLK1 among the memory blocks BLK1 to BLKz shown in FIG. 16.

Referring to FIG. 17, in the memory block BLK1, a plurality of word lines may be arranged in parallel to each other between a first select line and a second select line. The first select line may be a source select line SSL, and the second select line may be a drain select line DSL. More specifically, the memory block BLK1 may include a plurality of strings ST coupled between bit lines BL1 to BLn and a source line SL. The bit lines BL1 to BLn shown in FIG. 17 may be the first to nth bit lines BL1 to BLn shown in FIG. 16. The bit lines BL1 to BLn may be respectively coupled to the strings ST, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells MC1 to MC16, and a drain select transistor DAT, which are coupled in series to each other between the source line SL and the first bit line BL1. At least one source select transistor SST and at least one drain select transistor DST may be included in one string ST, and memory cells of which number is greater than that of the memory cells MC1 to MC16 shown in the drawing may be included in the one string ST.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. Gates of source select transistors SST included in different strings ST may be coupled to the source select line SSL, and gates of drain select transistors DST included in different strings ST may be coupled to the drain select line DSL. Gates of the memory cells MC1 to MC16 may be coupled to a plurality of word lines WL1 to WL16. A group of memory cells coupled to the same word line among memory cells included in different strings ST may be referred to as a physical page PG. Therefore, physical pages PG corresponding to the number of the word lines WL1 to WL16 may be included in the memory block BLK1. In FIG. 17, the source line SL, the source select line SSL, the word lines WL1 to WL16, and the drain select line DSL may be included in the row lines RL shown in FIG. 16.

When one memory cell is a Single Level Cell (SLC) storing one-bit data, one physical page PG may store one logical page (LPG) of data. When one memory cell may store two or more-bit data, one physical page PG may store two or more LPGs of data.

Figure 18:
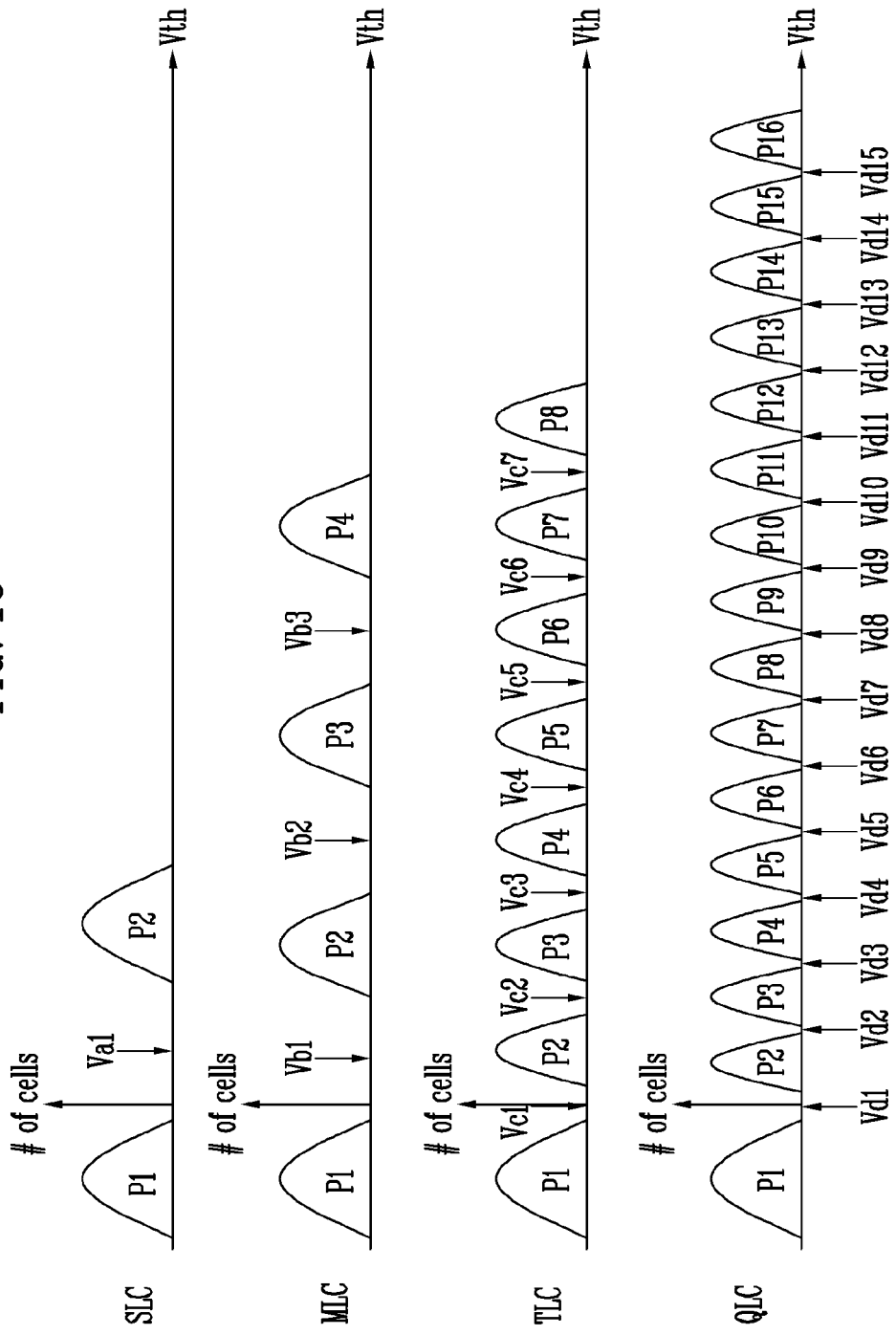
FIG. 18 illustrates threshold voltage distributions according to a number of bits stored in a memory cell.

FIG. 18 is a diagram illustrating threshold voltage distributions according to a bit number stored in a memory cell.

Referring to FIG. 18, the horizontal axis of each graph represents magnitudes of threshold voltages, and the vertical axis of each graph represents numbers of memory cells.

When a memory cell is an SLC storing one-bit data, the memory cell may have a threshold voltage corresponding to any one of a first program state P1 and a second program state P2.

A read voltage Va1 may be a voltage for distinguishing the first program state P1 and the second program state P2 from each other. Since a memory cell having the first program state P1 has a threshold voltage lower than the read voltage Va1, the memory cell may be read as an on-cell. Since a memory cell having the second program state P2 has a threshold voltage higher than the read voltage Va1, the memory cell may be read as an off-cell.

When a memory cell is an MLC storing two-bit data, the memory cell may have a threshold voltage corresponding to any one of first to fourth program states P1 to P4.

First to third read voltages Vb1 to Vb3 may be read voltages for distinguishing the first to fourth program states P1 to P4 from each other. The first read voltage Vb1 may be a read voltage for distinguishing the first program state P1 and the second program state P2 from each other. The second read voltage Vb2 may be a read voltage for distinguishing the second program state P2 and the third program state P3 from each other. The third read voltage Vb3 may be a read voltage for distinguishing the third program state P3 and the fourth program state P4 from each other.

When a memory cell is a TLC storing three-bit data, the memory cell may have a threshold voltage corresponding to any one of first to eighth program states P1 to P8.

First to seventh read voltages Vc1 to Vc7 may be read voltages for distinguishing the first to eighth program states P1 to P8 from each other. The first read voltage Vc1 may be a read voltage for distinguishing the first program state P1 and the second program state P2 from each other. The second read voltage Vc2 may be a read voltage for distinguishing the second program state P2 and the third program state P3 from each other. In this manner, the seventh read voltage Vc7 may be a read voltage for distinguishing the seventh program state P7 and the eighth program state P8 from each other.

When a memory cell is a QLC storing four-bit data, the memory cell may have a threshold voltage corresponding to any one of first to sixteenth program states P1 to P16.

First to fifteenth read voltages Vd1 to Vd15 may be read voltages for distinguishing the first to sixteenth program states P1 to P16 from each other. The first read voltage Vd1 may be a read voltage for distinguishing the first program state P1 and the second program state P2 from each other. The second read voltage Vd2 may be a read voltage for distinguishing the second program state P2 and the third program state P3 from each other. In this manner, the fifteenth read voltage Vd15 may be a read voltage for distinguishing the fifteenth program state P15 and the sixteenth program state P16 from each other.

A number of program states and a number of read voltages for distinguishing the program states from each other can increase as a number of data bits stored by one memory cell increases.

Figure 19:
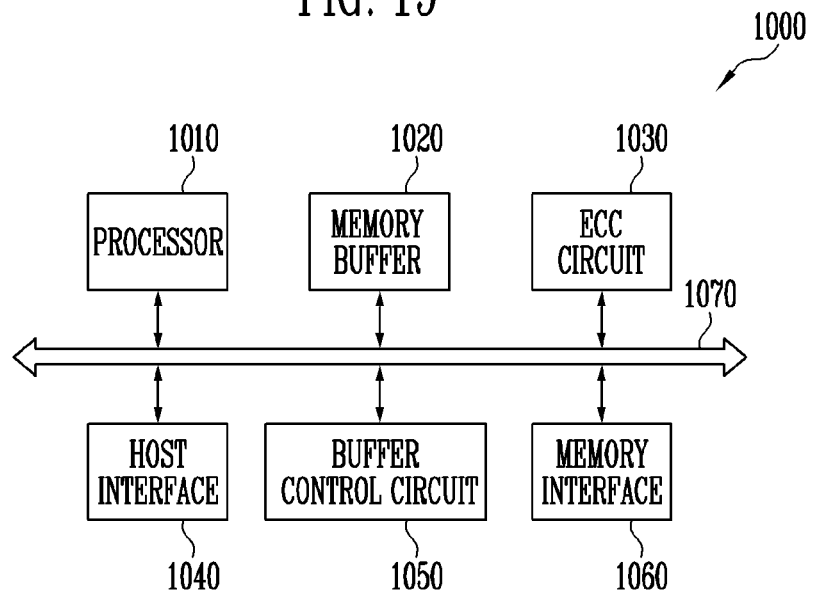
FIG. 19 illustrates another embodiment of the memory controller shown in FIG. 1.

FIG. 19 is a diagram illustrating a memory controller 1000 that may be used in an embodiment as the memory controller 200 shown in FIG. 1.

The memory controller 1000 is coupled to a host and a memory device. The memory controller 1000 may access the memory device in response to a request received from the host. The memory controller 1000 may provide an interface between the memory device and the host. The memory controller 1000 may drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory, a buffer memory, or combinations thereof.

The processor 1010 may perform a function of a flash translation layer (FTL). The processor 1010 may translate a logical address (LA) provided by the host through the FTL into a physical address (PA). The FTL may receive an LA, using a mapping table, to translate the LA into a PA. Several address mapping methods of the FTL exist according to mapping units. Representative address mapping methods include a page mapping method, a block mapping method, and a hybrid mapping method.

The processor 1010 may randomize data received from the host. For example, the processor 1010 may randomize data received from the host, using a randomizing seed. The randomized data is provided as data to be stored to the memory device to be programmed in the memory cell array.

In a read operation, the processor 1010 may derandomize data received from the memory device. For example, the processor 1010 may derandomize data received from the memory device, using a derandomizing seed. The derandomized data may be output to the host.

In an embodiment, the processor 1010 may perform randomizing and derandomizing by executing software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as that of a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a NonVolatile Memory Express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 20:
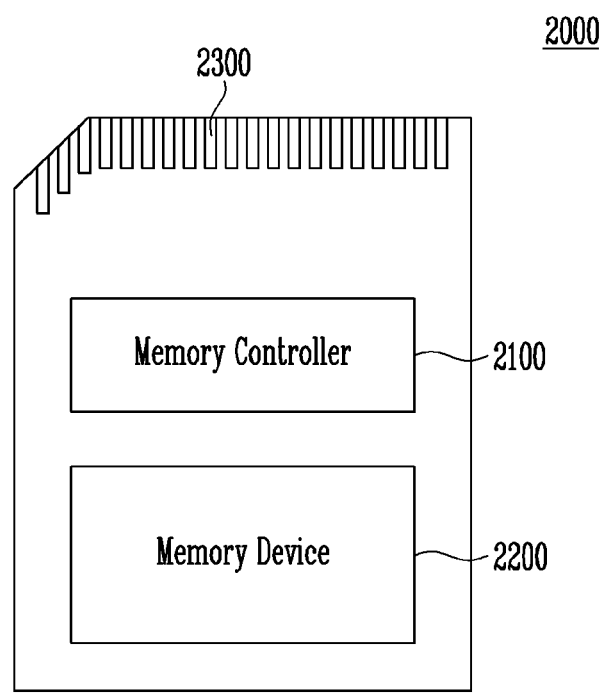
FIG. 20 illustrates a memory card system to which the storage device is applied in accordance with an embodiment of the present disclosure.

FIG. 20 is a block diagram illustrating a memory card system to which the storage device is applied in accordance with an embodiment of the present disclosure.

Referring to FIG. 20, the memory card system 2000 includes a memory controller 2100, a memory device, and a connector 2300.

The memory controller 2100 is coupled to the memory device 2200. The memory controller 2100 may access the memory device 2200. The memory controller 2100 may be implemented identically to the memory controller 200 described with reference to FIG. 2.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque Magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

The memory controller 2100 shown in FIG. 20 may be the memory controller 200 described with reference to FIG. 1. Also, the memory device 2200 may correspond to the memory device 100 described with reference to FIG. 1.

Figure 21:
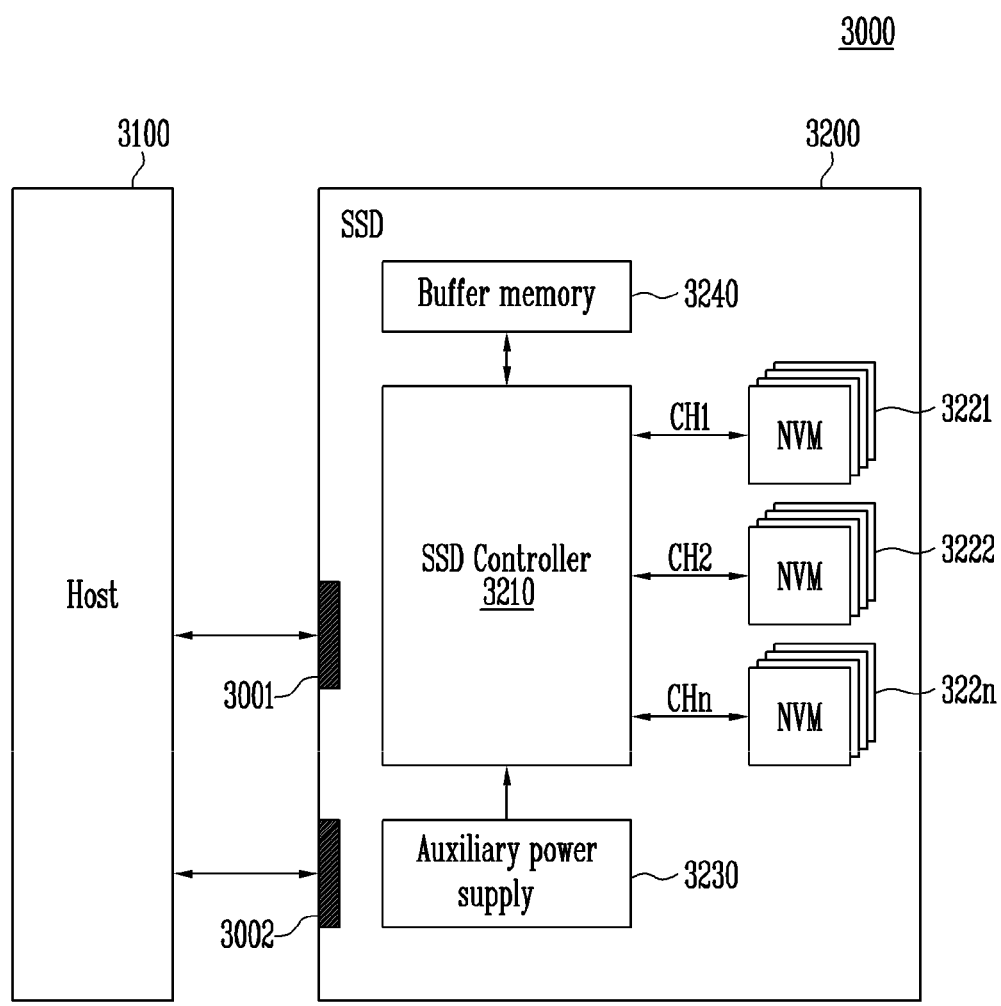
FIG. 21 illustrates a Solid State Drive (SSD) system to which the storage device is applied in accordance with an embodiment of the present disclosure.

FIG. 21 is a block diagram illustrating a Solid State Drive (SSD) system to which the storage device is applied in accordance with an embodiment of the present disclosure.

Referring to FIG. 21, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a Graphics RAM (GRAM) or nonvolatile memories such as a FRAM, a ReRAM, an STT-MRAM, and a PRAM.

Figure 22:
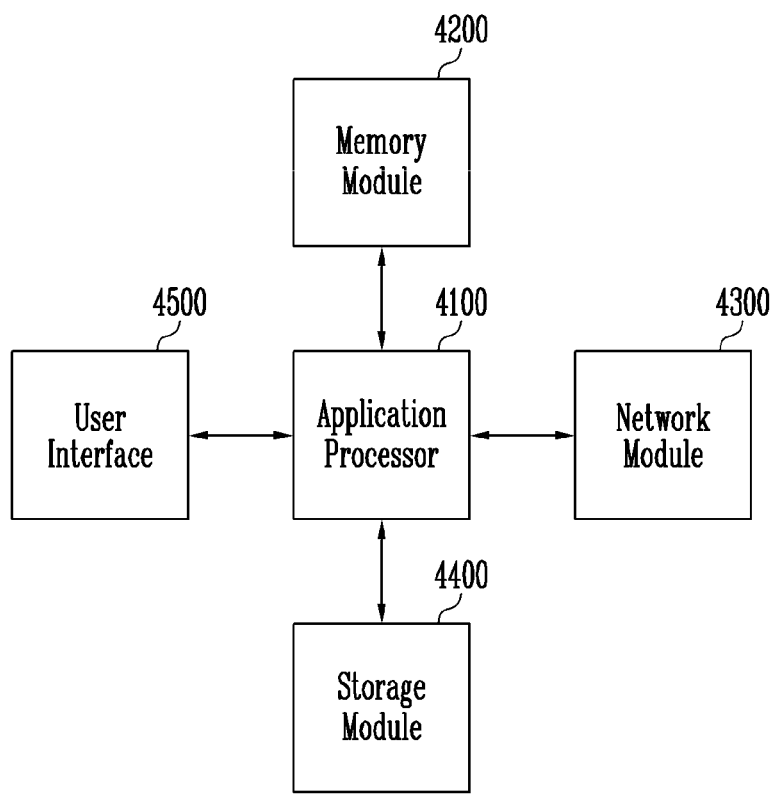
FIG. 22 illustrates a user system to which the storage device is applied in accordance with an embodiment of the present disclosure.

FIG. 22 is a block diagram illustrating a user system to which the storage device is applied in accordance with an embodiment of the present disclosure.

Referring to FIG. 22, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a storage device having an improved write response speed and an operating method thereof.

While the present disclosure has been shown and described with reference to certain illustrative embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described illustrative embodiments but should be determined by not only the appended claims but also the equivalents thereof.

In the above-described embodiments, all steps may be selectively performed or parts of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the illustrative embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory controller for controlling a memory device, the memory device including a plurality of turbo write blocks and a plurality of normal memory blocks, the memory controller comprising:
   a turbo write controller configured to generate a physical address at which write data corresponding to a write request received from a host is to be stored according to turbo write mode information and turbo write block information, the turbo write mode information and turbo write block information being included in the write request; and a memory operation controller configured to control the memory device to store the write data in memory cells corresponding to the physical address, wherein the turbo write mode information is information indicating whether the write data is to be stored in the plurality of turbo write blocks, wherein the turbo write block information is information indicating a turbo write block in which the write data is to be stored among the plurality of turbo write blocks, and wherein the turbo write controller receives, from the host, a turbo write flush request, acquires target block information indicating a target block from the turbo write flush request, and instructs the memory device to transfer data stored in the target block among the plurality of turbo write blocks to any one of the plurality of normal memory blocks.

2. The memory controller of claim 1, wherein a first turbo write block of the plurality of turbo write blocks includes memory cells being programmed to each store a first number of data bits, a second turbo write block of the plurality of turbo write blocks includes memory cells being programmed to each store a second number of data bits, and the plurality of normal memory blocks are programmed to store a third number of data bits, wherein the second number of data bits is different than the first number of data bits, and wherein the third number of data bits is greater than the first number of data bits and greater than the second number of data bits.

3. The memory controller of claim 2, wherein the memory cells included in the first turbo write block are programmed as single level cells (SLCs), and memory cells included in the plurality of normal memory blocks are programmed as quadruple level cells (QLCs).

4. The memory controller of claim 2, wherein the memory cells included in the first turbo write block programmed as any one of single level cells (SLCs), multi-level cells (MLCs), and triple level cells (QLCs).

5. The memory controller of claim 1, wherein memory cells included in the plurality of normal memory blocks are programmed as quadruple level cells (QLCs).

6. The memory controller of claim 1, wherein the turbo write block information includes information on a number of data bits stored in one memory cell included in the turbo write block in which the write data is to be stored among the plurality of turbo write blocks.

7. The memory controller of claim 1, further comprising a map data storage configured to store information on a physical address of the plurality of normal memory blocks and information on a physical address of the plurality of turbo write blocks.

8. The memory controller of claim 1, wherein the turbo write controller acquires, from the turbo write flush request, storage block information indicating a storage block as a memory block in which the data stored in the target block is to be stored.

9. The memory controller of claim 8, wherein the memory operation controller controls the memory device to move the data stored in the target block to the storage block.

10. The memory controller of claim 8, wherein the memory operation controller controls the memory device to read the data stored in the target block and program the read data in the storage block.

11. The memory controller of claim 8, wherein a number of data bits storable in a memory cell included in the target block is different from a number of data bits storable in a memory cell included in the storage block.

12. A method for operating a memory controller for controlling a memory device, the memory device including a plurality of turbo write blocks and a plurality of normal memory blocks, the method comprising:

receiving a write request from a host, the write request including turbo write mode information and turbo write block information;

generating a physical address at which write data corresponding to the write request is to be stored according to the turbo write mode information and the turbo write block information;

controlling the memory device to store the write data in a target block corresponding to the physical address among the plurality of turbo write blocks and the plurality of normal memory blocks;

in response to receiving a turbo write flush request from the host, acquiring target block information indicating the target block from the turbo write flush request; and transferring data stored in the target block to any one of the plurality of normal memory blocks, wherein the turbo write mode information is information indicating whether the write data is to be stored in the plurality of turbo write blocks, and the turbo write block information is information indicating a turbo write block in which the write data is to be stored among the plurality of turbo write blocks, wherein the plurality of turbo write blocks respectively include memory cells being programmed to store different numbers of data bits.

13. The method of claim 12, wherein the turbo write block information includes information on a number of data bits stored in one memory cell included in the turbo write block in which the write data is to be stored among the plurality of turbo write blocks.

14. The method of claim 12, wherein controlling the memory device to store the write data includes:

in response to the turbo write mode information being in a set state, controlling the memory device to store the write data in any one turbo write block among the plurality of turbo write blocks.

15. The method of claim 12, wherein controlling the memory device to store the write data includes:

in response to the turbo write mode information being in a reset state, controlling the memory device to store the write data in any one normal block among the plurality of normal memory blocks.

16. The method of claim 12, wherein the plurality of turbo write blocks are memory blocks allocated according to a capacity previously indicated in a request of the host.

17. The method of claim 12, wherein the plurality of turbo write blocks are allocated whenever the write request including the turbo write mode information in a set state is received.

18. A storage device comprising:

a memory device including a plurality of turbo write blocks and a plurality of normal memory blocks; and a memory controller configured to control the memory device to store data corresponding to a write request received from a host in any one block among the plurality of turbo write blocks and the plurality of normal memory blocks, in response to the write request, wherein the plurality of turbo write blocks respectively include memory cells being programmed to store different numbers of data bits, and wherein the memory controller receives, from the host, a turbo write flush request instructing the memory device to move data stored in a target block among the plurality of turbo write blocks, the turbo write flush request including target block information and storage block information, and controls the memory device to transfer the data stored in the target block according to the target block information into a storage block according to the storage block information.

* * * * *